(12) United States Patent
Lin et al.

(10) Patent No.: US 12,433,081 B2
(45) Date of Patent: Sep. 30, 2025

(54) DISPLAY DEVICE, LIGHT-EMITTING DIODE SUBSTRATE, AND FABRICATION METHOD OF DISPLAY DEVICE

(71) Applicant: Au Optronics Corporation, Hsinchu (TW)

(72) Inventors: Shih-Hsiung Lin, Hsinchu (TW); Yang-En Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 812 days.

(21) Appl. No.: 17/344,979

(22) Filed: Jun. 11, 2021

(65) Prior Publication Data
US 2022/0028924 A1    Jan. 27, 2022

Related U.S. Application Data

(60) Provisional application No. 63/056,817, filed on Jul. 27, 2020.

(30) Foreign Application Priority Data

Jan. 13, 2021    (CN) .......................... 202110042784.4

(51) Int. Cl.
*H10H 29/14*    (2025.01)
*H10H 20/01*    (2025.01)
(Continued)

(52) U.S. Cl.
CPC .......... *H10H 29/142* (2025.01); *H10H 20/01* (2025.01); *H10H 20/018* (2025.01);
(Continued)

(58) Field of Classification Search
CPC .... H10H 29/142; H10H 20/01; H10H 20/018; H10H 20/8312; H10H 20/857;
(Continued)

(56) References Cited

U.S. PATENT DOCUMENTS 9,437,782 B2    9/2016    Bower et al.
9,705,039 B2    7/2017    Obata et al.
(Continued)

FOREIGN PATENT DOCUMENTS

CN    109643743    4/2019
DE    102017112866    12/2018
(Continued)

*Primary Examiner* — Ratisha Mehta
(74) *Attorney, Agent, or Firm* — JCIPRNET

(57) ABSTRACT

A display device includes a circuit substrate and a light-emitting diode. Two electrodes of the light-emitting diode are connected to two pads of the circuit substrate. Each electrode of the light-emitting diode includes a first conductive layer, a barrier layer, and a metal layer. The first conductive layer is connected to a semiconductor stack layer of the light-emitting diode. The barrier layer is electrically connected to the semiconductor stack layer of the light-emitting diode through the first conductive layer. The adhesion of the material selected for the first conductive layer to the semiconductor stack layer is greater than the adhesion of the material selected for the barrier layer to the semiconductor stack layer. The metal layer electrically connects the barrier layer to the corresponding one of the pads. The melting point of the metal layer is lower than 260 degrees Celsius.

22 Claims, 29 Drawing Sheets

(51) Int. Cl.
  *H10H 20/831* (2025.01)
  *H10H 20/857* (2025.01)
(52) U.S. Cl.
  CPC ...... *H10H 20/8312* (2025.01); *H10H 20/857* (2025.01); *H10H 20/032* (2025.01); *H10H 20/0364* (2025.01)
(58) Field of Classification Search
  CPC ............ H10H 20/032; H10H 20/0364; H10H 20/832; H10H 20/83; H10H 20/8506; H01L 25/0753; H01L 25/167; H01L 25/50; H01L 2224/08225; Y02P 70/50; H05K 3/303
  See application file for complete search history.

(56) References Cited

U.S. PATENT DOCUMENTS

| | | | |
|---|---|---|---|
| 9,837,375 | B2 | 12/2017 | Chinnusamy et al. |
| 9,960,320 | B2 | 5/2018 | Obata et al. |
| 10,103,069 | B2 | 10/2018 | Bower et al. |
| 10,153,248 | B2 | 12/2018 | Chinnusamy et al. |
| 10,163,735 | B2 | 12/2018 | Bower et al. |
| 10,410,988 | B2 | 9/2019 | Ho et al. |
| 10,505,075 | B2 | 12/2019 | Obata et al. |
| 10,636,937 | B2 | 4/2020 | Liao |
| 10,944,034 | B2 | 3/2021 | Kuo |
| 10,991,846 | B2 | 4/2021 | Ting et al. |
| 11,315,898 | B2 | 4/2022 | Mueller et al. |
| 11,430,935 | B2 | 8/2022 | Kuo |
| 2005/0148194 | A1* | 7/2005 | Lan .................. H10H 20/01335 438/706 |
| 2005/0231103 | A1* | 10/2005 | Kim ..................... H10K 59/873 313/504 |
| 2009/0085052 | A1* | 4/2009 | Ko ..................... H10H 20/8506 438/27 |
| 2011/0316039 | A1* | 12/2011 | Liu ....................... H10H 20/831 257/E33.063 |
| 2012/0138889 | A1* | 6/2012 | Tachibana .......... H10H 20/8252 257/E33.048 |
| 2014/0077213 | A1* | 3/2014 | Zhang ................. H01L 27/1214 438/158 |
| 2016/0276560 | A1 | 9/2016 | Obata et al. |
| 2017/0186740 | A1 | 6/2017 | Cok et al. |
| 2017/0250158 | A1 | 8/2017 | Chinnusamy et al. |
| 2017/0250307 | A1 | 8/2017 | Obata et al. |
| 2017/0287789 | A1 | 10/2017 | Bower et al. |
| 2018/0047688 | A1 | 2/2018 | Ho et al. |
| 2018/0068976 | A1 | 3/2018 | Chinnusamy et al. |
| 2018/0090394 | A1 | 3/2018 | Bower et al. |
| 2018/0204980 | A1* | 7/2018 | Obata ..................... H01L 33/40 |
| 2019/0027647 | A1* | 1/2019 | Song ..................... H01L 33/647 |
| 2019/0067241 | A1 | 2/2019 | Chinnusamy et al. |
| 2019/0081200 | A1 | 3/2019 | Ting et al. |
| 2019/0097081 | A1 | 3/2019 | Liao |
| 2019/0288171 | A1* | 9/2019 | Niizeki ..................... H01L 24/33 |
| 2019/0355689 | A1 | 11/2019 | Ho et al. |
| 2019/0386173 | A1 | 12/2019 | Chen et al. |
| 2020/0066954 | A1 | 2/2020 | Kuo |
| 2020/0075821 | A1* | 3/2020 | Chuang ................. H01L 33/405 |
| 2020/0211997 | A1 | 7/2020 | Mueller et al. |
| 2020/0221616 | A1 | 7/2020 | Liao |
| 2020/0294962 | A1 | 9/2020 | Katz et al. |
| 2020/0313049 | A1 | 10/2020 | Huang et al. |
| 2021/0005799 | A1 | 1/2021 | Ishida et al. |
| 2021/0057378 | A1 | 2/2021 | Chinnusamy et al. |
| 2021/0119096 | A1 | 4/2021 | Kuo |
| 2021/0151622 | A1 | 5/2021 | Ting et al. |
| 2021/0265327 | A1 | 8/2021 | Koo et al. |
| 2021/0280743 | A1* | 9/2021 | Wang ..................... H01L 33/22 |
| 2022/0108978 | A1 | 4/2022 | Kajiyama et al. |
| 2022/0208715 | A1 | 6/2022 | Mueller et al. |
| 2022/0285596 | A1* | 9/2022 | Liu ....................... H01L 33/486 |

FOREIGN PATENT DOCUMENTS

| | | |
|---|---|---|
| DE | 102018103431 | 8/2019 |
| JP | 2006303542 | 11/2006 |
| JP | 2007200920 | 8/2007 |
| JP | 2011066053 | 3/2011 |
| JP | 2012169368 | 9/2012 |
| JP | 2015138870 | 7/2015 |
| JP | 2020031210 | 2/2020 |
| JP | 2020064118 | 4/2020 |
| JP | 2020068313 | 4/2020 |
| TW | I631633 | 8/2018 |
| TW | I648871 | 1/2019 |
| TW | I653694 | 3/2019 |
| TW | I677034 | 11/2019 |
| TW | I677948 | 11/2019 |
| TW | I695453 | 6/2020 |
| TW | I699011 | 7/2020 |
| WO | 2019188063 | 10/2019 |
| WO | 2020013478 | 1/2020 |

* cited by examiner

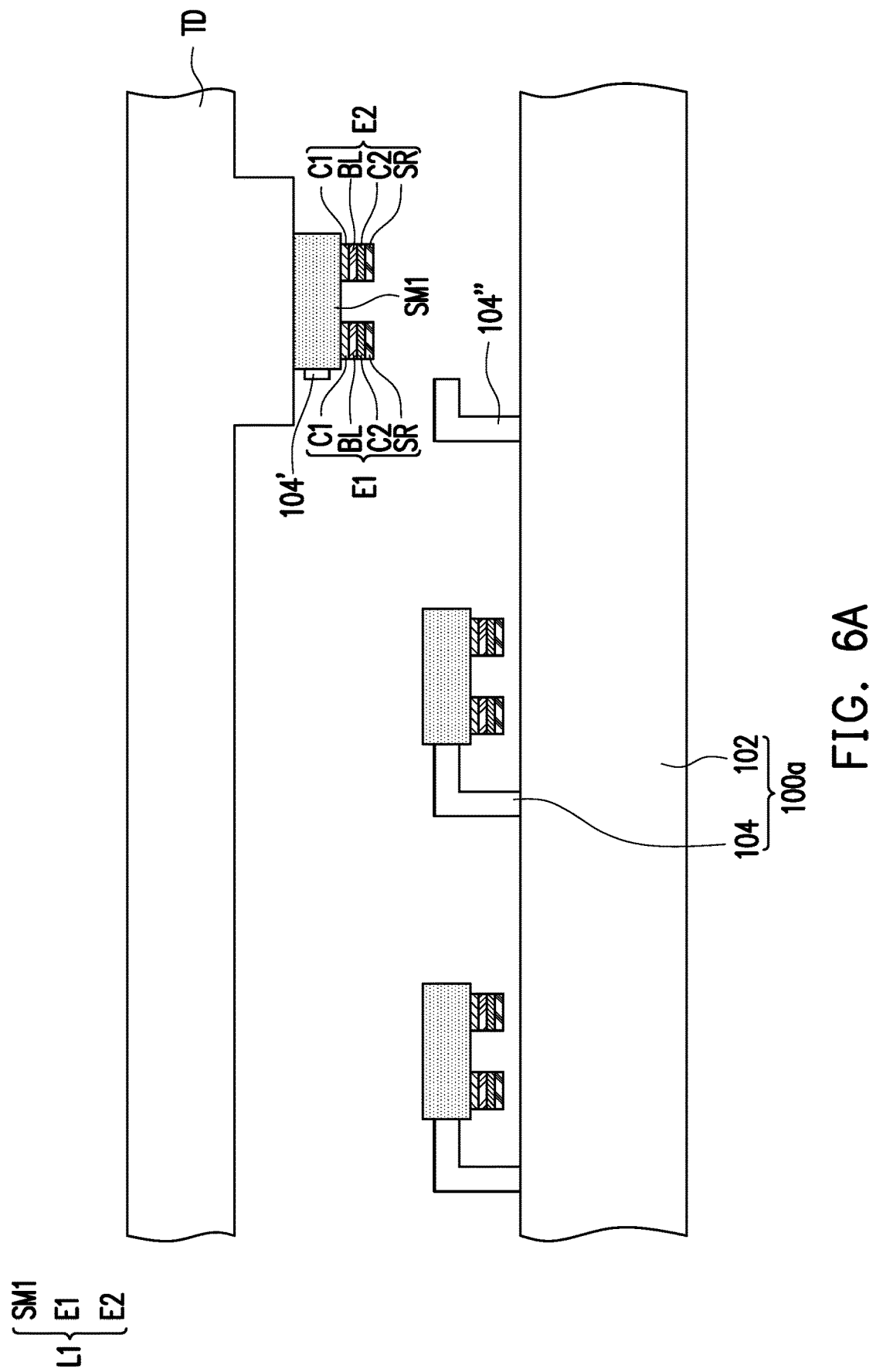

DISPLAY DEVICE, LIGHT-EMITTING DIODE SUBSTRATE, AND FABRICATION METHOD OF DISPLAY DEVICE

CROSS-REFERENCE TO RELATED APPLICATION

This application claims the priority benefits of U.S. provisional application Ser. No. 63/056,817, filed on Jul. 27, 2020, and Chinese application serial no. 202110042784.4, filed on Jan. 13, 2021. The entirety of each of the above-mentioned patent applications is hereby incorporated by reference herein and made a part of this specification.

BACKGROUND

Technical Field

The disclosure relates to a display device, a light-emitting diode substrate, and a fabrication method of a display device.

Description of Related Art

A light-emitting diode (LED) is a light-emitting element that has the properties of low power consumption, high brightness, high resolution, and high color saturation, and is thus adapted for construction of a pixel structure of a light-emitting diode display panel.

The technique of transferring the light-emitting diode onto a circuit substrate is referred to as mass transfer. Generally speaking, a conductive adhesive in an entire surface may be formed on the circuit substrate, and then the light-emitting diode may be transferred onto the circuit substrate by a transfer device. The light-emitting diode is fixed by the conductive adhesive formed on the circuit substrate, and the transfer device is removed after the light-emitting diode is fixed to the conductive adhesive. Conventionally, during transfer of the light-emitting diode, erroneously transferred light-emitting diodes, adversely affected light-emitting diodes, or the like is likely to occur, preventing normal operation of some pixels in the display device, and affecting display quality of the display device. Generally speaking, the erroneously transferred or adversely affected light-emitting diodes are removed, and a light-emitting diode for repair is transferred onto the circuit substrate to replace the removed light-emitting diode. However, the conductive adhesive is conventionally formed on the circuit substrate in a large area, and is difficult to clean up. In addition, during repair, it is also difficult and time-consuming to only form the original conductive adhesive in a specific small region.

SUMMARY

The disclosure provides a display device, in which bonding between a light-emitting diode and a circuit substrate is improved.

The disclosure provides a light-emitting diode substrate, in which bonding between a light-emitting diode and a circuit substrate is improved.

The disclosure provides a fabrication method of a light-emitting diode substrate, in which cracks at the bonding place between a light-emitting diode and a circuit substrate is reduced.

At least one embodiment of the disclosure provides a display device. The display device includes a circuit substrate and a light-emitting diode. Two electrodes of the light-emitting diode are connected to two pads of the circuit substrate. Each of the electrodes of the light-emitting diode includes a first conductive layer, a barrier layer, and a metal layer. The first conductive layer is connected to a semiconductor stack layer of the light-emitting diode. The barrier layer is electrically connected to the semiconductor stack layer of the light-emitting diode through the first conductive layer. An adhesion of a material selected for the first conductive layer to the semiconductor stack layer is greater than an adhesion of a material selected for the barrier layer to the semiconductor stack layer. The metal layer is electrically connecting the barrier layer to a corresponding one of the pads. A melting point of the metal layer is lower than 260 degrees Celsius.

At least one embodiment of the disclosure provides a light-emitting diode substrate. The light-emitting diode substrate includes a growth substrate and a light-emitting diode. The light-emitting diode includes a semiconductor stack layer and two electrodes. The semiconductor stack layer is formed on the growth substrate. The two electrodes are formed on the semiconductor stack layer. Each electrode includes a first conductive layer, a barrier layer, and a metal layer. The first conductive layer is formed on the semiconductor stack layer. The barrier layer is formed on the first conductive layer. An adhesion of a material selected for the first conductive layer to the semiconductor stack layer is greater than an adhesion of a material selected for the barrier layer to the semiconductor stack layer. The metal layer is formed on the barrier layer. A melting point of the metal layer is lower than 260 degrees Celsius.

At least one embodiment of the disclosure provides a fabrication method of a display device. The fabrication method of the display device includes the following. A plurality of light-emitting diodes are formed. One of the light-emitting diodes is transferred onto a circuit substrate. In addition, the one of the light-emitting diodes is heated. Each light-emitting diode includes a semiconductor stack layer and two electrodes. The two electrodes are formed on the semiconductor stack layer. Each electrodes comprises a first conductive layer, a barrier layer, and a metal layer. The first conductive layer is formed on the semiconductor stack layer. The barrier layer is formed on the first conductive layer. An adhesion of a material selected for the first conductive layer to the semiconductor stack layer is greater than an adhesion of a material selected for the barrier layer to the semiconductor stack layer. The metal layer is formed on the barrier layer. A melting point of the metal layer is lower than 260 degrees Celsius. The circuit substrate includes a plurality of pads. A position of one of the light-emitting diodes corresponds to two of the pads of the circuit substrate. The metal layers of one of the light-emitting diodes are eutectically bonded to two of the pads.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6A to FIG. 6C are schematic cross-sectional views of a fabrication method of a display device according to an embodiment of the disclosure.

DESCRIPTION OF THE EMBODIMENTS

Figure 1:
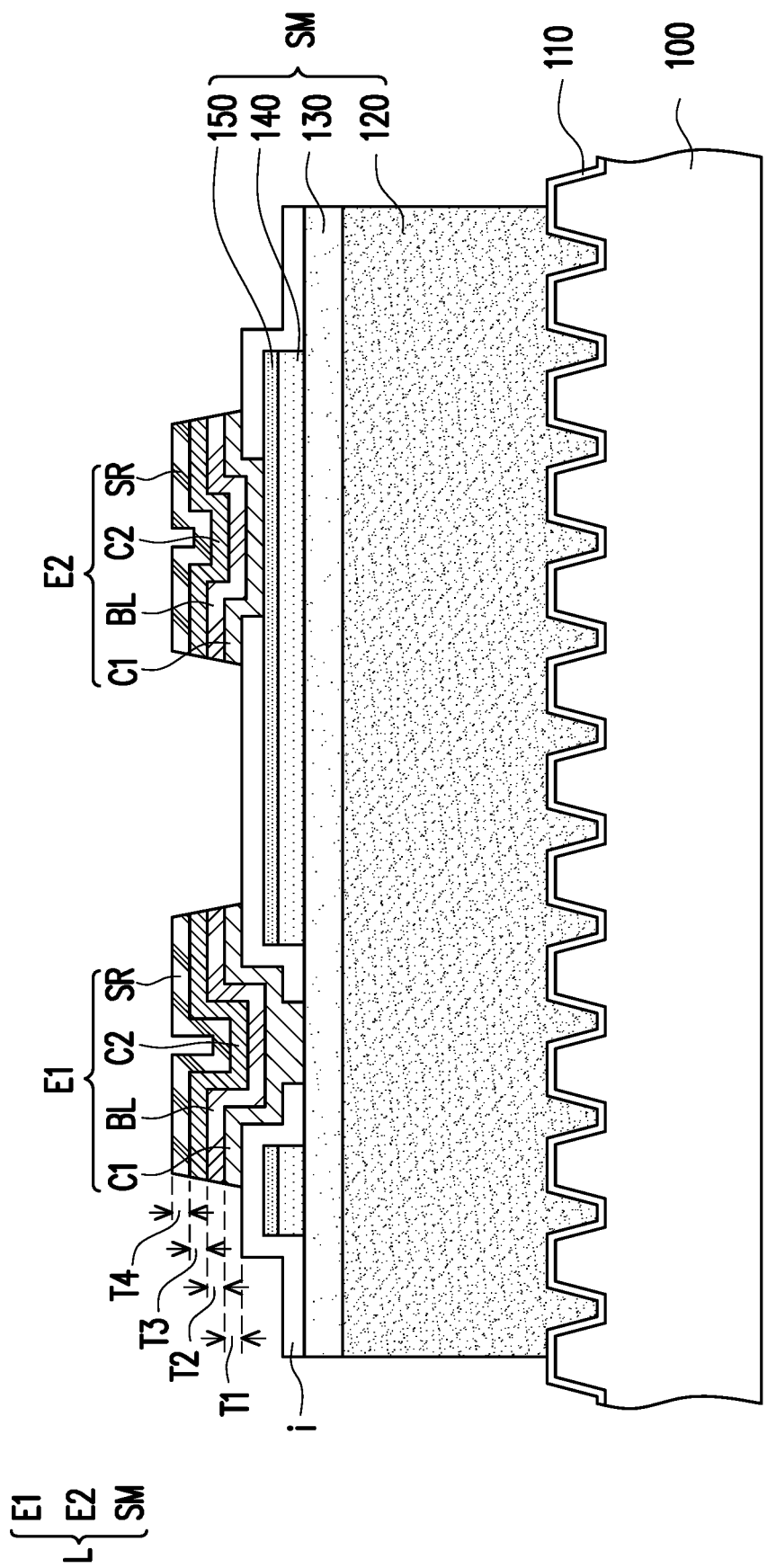
FIG. 1 is a schematic cross-sectional view of a light-emitting diode substrate according to an embodiment of the disclosure.

FIG. 1 is a schematic cross-sectional view of a light-emitting diode substrate according to an embodiment of the disclosure.

With reference to FIG. 1, a light-emitting diode substrate 10 includes a growth substrate 100 and a light-emitting diode L. The light-emitting diode L includes a semiconductor stack layer SM and two electrodes E1 and E2.

In some embodiment, the growth substrate 100 is a gallium arsenide (GaAs) substrate, a gallium phosphide (GaP) substrate, an indium phosphide (InP) substrate, a sapphire substrate, a silicon carbide (SiC) substrate, a gallium nitride (GaN) substrate, or other growth substrates adapted for an epitaxy process. In some embodiments, the surface of the growth substrate 100 is patterned through a nanoimprinting process, such that the growth substrate 100 has a surface with concavity and convexity. In some embodiments, a buffer layer 110 is formed on the surface of the growth substrate 100, and the buffer layer 110 facilitates an increase in the yield of the subsequent epitaxy process. In some embodiments, a material of the buffer layer 110 is aluminum nitride or other suitable materials.

The semiconductor stack layer SM is formed on the growth substrate 100. In some embodiments, the semiconductor stack layer SM is formed on the buffer layer 110 through an epitaxy process and a patterning process. The semiconductor stack layer SM includes a first semiconductor layer 130, a light-emitting layer 140, and a second semiconductor layer 150. One of the first semiconductor layer 130 and the second semiconductor layer 150 is an N-type doped semiconductor, and the other is a P-type doped semiconductor. For example, the first semiconductor layer 130 is an N-type semiconductor layer, and the second semiconductor layer 150 is a P-type semiconductor layer.

A material of the first semiconductor layer 130 and a material of the second semiconductor layer 150 include, for example, gallium nitride, indium gallium nitride (InGaN), gallium arsenide, an aluminum gallium indium phosphide (AlGaInP), or other materials composed of IIIA and VA elements or other suitable materials, but the disclosure is not limited thereto.

The light-emitting layer 140 is located between the first semiconductor layer 130 and the second semiconductor layer 150. The light-emitting layer 140 includes, for example, a quantum well (QW), such as a single quantum well (SQW), a multiple quantum well (MQW), or other quantum wells. Electric holes provided by the P-type doped semiconductor layer and electrons provided by the N-type doped semiconductor layer may be combined in the light-emitting layer 140, and energy may be released in the form of light.

In this embodiment, the semiconductor stack layer SM also includes a low-doped (or undoped) semiconductor layer 120. The semiconductor layer 120 is located between the first semiconductor layer 130 and the growth substrate 100. A material of the semiconductor layer 120 includes, for example, gallium nitride, indium gallium nitride (InGaN), gallium arsenide, an aluminum gallium indium phosphide (AlGaInP), or other materials composed of IIIA and VA elements or other suitable materials, but the disclosure is not limited thereto.

In this embodiment, the light-emitting diode L is a blue light-emitting diode or a green light-emitting diode. The materials of the semiconductor layer 120, the first semiconductor layer 130, the light-emitting layer 140, and the second semiconductor layer 150 include gallium nitride, and the growth substrate 100 is a sapphire substrate. Nonetheless, the disclosure is not limited thereto. In other embodiments, the light-emitting diode L is a light-emitting diode of other colors, and the materials of the semiconductor layer 120, the first semiconductor layer 130, the light-emitting layer 140, and the second semiconductor layer 150 include other materials.

An insulating layer i is formed on the semiconductor stack layer SM. The insulating layer i has at least two openings, respectively exposing part of the top surface of the first semiconductor layer 130 and part of the top surface of the second semiconductor layer 150.

The two electrodes E1 and E2 are formed on the semiconductor stack layer SM. In some embodiments, the electrodes E1 and E2 are respectively electrically connected to the first semiconductor layer 130 and the second semiconductor layer 150 through the openings of the insulating layer i.

The electrodes E1 and E2 each include a first conductive layer C1, a barrier layer BL, and a metal layer SR.

The first conductive layer C1 is formed on the semiconductor stack layer SM, and is respectively in contact with the first semiconductor layer 130 and the second semiconductor layer 150. The barrier layer BL is formed on the first conductive layer C1, and the barrier layer BL covers the entire upper surface of the first conductive layer C1. In some embodiments, an adhesion of a material selected for the first conductive layer C1 to the semiconductor stack layer SM is greater than an adhesion of a material selected for the barrier layer BL to the semiconductor stack layer SM. In other words, compared to the barrier layer BL, attachment of the first conductive layer C1 to the first semiconductor layer 130 and the second semiconductor layer 150 may be improved.

In some embodiments, a thickness T1 of the first conductive layer C1 is 0.01 μm to 0.09 μm. In some embodiments, the material selected for the first conductive layer C1 includes titanium, chromium, or a combination of the above materials or other materials with good adhesion to an epitaxial layer. In some embodiments, the first conductive layer C1 is formed, for example, by evaporation, electroplating, or other suitable processes.

In some embodiments, a thickness T2 of the barrier layer BL is 0.1 µm to 5 µm. In some embodiments, the material selected for the barrier layer BL includes nickel, copper, palladium, or a combination of the above materials. In some embodiments, the barrier layer BL is formed, for example, by evaporation, electroplating, or other suitable processes.

The metal layer SR is formed on the barrier layer BL. The melting point of the metal layer SR is lower than 260 degrees Celsius.

In some embodiments, a thickness T4 of the metal layer SR is 0.1 µm to 8 µm. In some embodiment, a material selected for the metal layer SR includes tin, indium, bismuth, tin-bismuth mixed metal, tin-indium mixed metal, tin-copper mixed metal, tin-silver mixed metal, tin-antimony mixed metal, tin-zinc mixed metal, tin-silver-copper mixed metal, tin-silver-copper-bismuth mixed metal, or a combination of the above materials. In some embodiments, the metal layer SR is formed, for example, by evaporation, electroplating, or other suitable processes.

In some embodiment, when the metal layer SR is heated to eutectically bond the metal layer SR to other components, the barrier layer BL shields metal elements in the metal layer SR from being diffused to the first conductive layer C1, thereby preventing that intermetallic compounds are not generated from reaction because of adversely affected adhesion between the metal layer SR and the first conductive layer C1, resulting in cracks between the metal layer SR and the first conductive layer C1. In this way, bonding between the light-emitting diode L and other components is improved.

In some embodiments, the electrodes E1 and E2 each selectively include a second conductive layer C2. The second conductive layer C2 is formed on the barrier layer BL and is located between the barrier layer BL and the metal layer SR. The second conductive layer C2 covers the entire upper surface of the barrier layer BL. A wettability of the metal layer SR on a material selected for the second conductive layer C2 is greater than a wettability of the metal layer SR on the material selected for the barrier layer BL. In other words, flattening of the metal layer SR on the surface of the second conductive layer C2 may be improved. In some embodiments, the metal layer SR covers the entire upper surface of the second conductive layer C2.

In some embodiments, a thickness T3 of the second conductive layer C2 is less than or equal to the thickness T2 of the barrier layer BL, thereby reducing intermetallic compounds formed between the second conductive layer C2 and the metal layer SR. In some embodiments, the thickness T3 of the second conductive layer C2 is 0.01 µm to 0.1 µm. In some embodiments, the material selected for the second conductive layer C2 includes gold, silver, copper, palladium, nickel, or a combination of the above materials. In some embodiments, the second conductive layer C2 is form, for example, by evaporation, electroplating, or other suitable processes.

In some embodiments, the first conductive layer C1 is conformally formed in the opening of the insulating layer i and on the surface of the insulating layer i. The barrier layer BL is conformally formed on the first conductive layer C1. The second conductive layer C2 is conformally formed on the barrier layer BL. The metal layer SR is conformally formed on the second conductive layer C2. In some embodiments, the center of the first conductive layer C1, the barrier layer BL, the second conductive layer C2, and the metal layer SR corresponding to the opening of the insulating layer i is slightly recessed downward. Nonetheless, the disclosure is not limited thereto.

In some embodiment, the shape of the first conductive layer C1, the barrier layer BL, the second conductive layer C2, and the metal layer SR may be defined by the same mask. Therefore, the shape of the perpendicular projection of the first conductive layer C1 on the growth substrate 100, the shape of the perpendicular projection of the barrier layer BL on the growth substrate 100, the shape of the perpendicular projection of the second conductive layer C2 on the growth substrate 100, and the shape of the perpendicular projection of the metal layer SR on the growth substrate 100 may be substantially the same as each other. In other embodiments, the upper layer of each of the electrodes E1 and E2 selectively covers the side surface of the lower layer. For example, the upper layer may be in contact with the side surface of the lower layer because of the use of optical masks of different sizes in the manufacturing process or errors during the evaporation. For example, the metal layer SR selectively covers the side surface of the second conductive layer C2, the side surface of the barrier layer BL, and the side surface of the first conductive layer C1. Nonetheless, the disclosure is not limited thereto.

Figure 2:
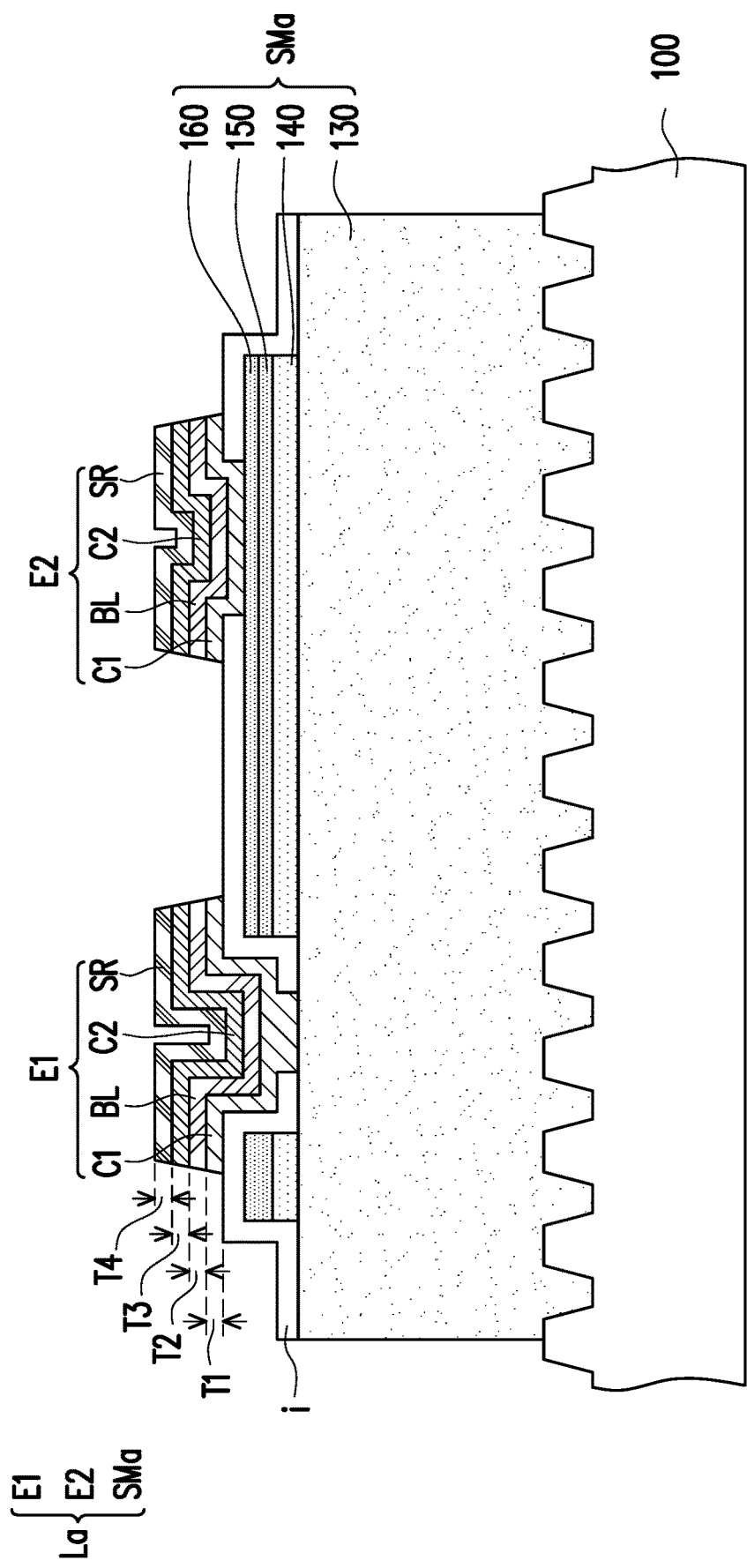
FIG. 2 is a schematic cross-sectional view of a light-emitting diode substrate according to an embodiment of the disclosure.

FIG. 2 is a schematic cross-sectional view of a light-emitting diode substrate according to an embodiment of the disclosure. It should be noted herein that the reference numerals and part of the contents of the embodiment of FIG. 1 remain to be used in the embodiment of FIG. 2, where the same or similar reference numerals are used to refer to the same or similar elements, and the description of the same technical content is omitted. Reference may be made to the above embodiments for the description of the omitted part, which will not be repeated herein.

The main difference between a light-emitting diode substrate 20 of FIG. 2 and the light-emitting diode substrate 10 of FIG. 1 lies in that a semiconductor stack layer SMa of the light-emitting diode substrate 20 is different from the semiconductor stack layer SM of the light-emitting diode substrate 10.

With reference to FIG. 2, the semiconductor stack layer SMa is formed on the growth substrate 100. In some embodiments, the semiconductor stack layer SMa is formed on the buffer layer 110 through an epitaxy process. The semiconductor stack layer SMa includes the first semiconductor layer 130, the light-emitting layer 140, and the second semiconductor layer 150. One of the first semiconductor layer 130 and the second semiconductor layer 150 is an N-type doped semiconductor, and the other is a P-type doped semiconductor. For example, the first semiconductor layer 130 is an N-type semiconductor layer, and the second semiconductor layer 150 is a P-type semiconductor layer. The light-emitting layer 140 is located between the first semiconductor layer 130 and the second semiconductor layer 150.

In this embodiment, the semiconductor stack layer SMa also includes a third semiconductor layer 160. The third semiconductor layer 160 is formed on the second semiconductor layer 150. In addition, the third semiconductor layer 160 and the second semiconductor layer 150 are semiconductor layers of the same type (both are P-type semiconductor layers, for example).

In this embodiment, a light-emitting diode La is a red light-emitting diode, and the materials of the semiconductor layer 120, the first semiconductor layer 130, the light-emitting layer 140, and the second semiconductor layer 150 include an aluminum gallium indium phosphide, a material of the third semiconductor layer 160 includes gallium phosphide, and the growth substrate 100 includes a gallium arsenide substrate. Nonetheless, the disclosure is not limited thereto. In other embodiments, the light-emitting diode La is a light-emitting diode of other colors, and the materials of the first semiconductor layer 130, the light-emitting layer 140, the second semiconductor layer 150, and the third semiconductor layer 160 include other materials.

FIG. 3A to FIG. 3G are schematic cross-sectional views of a fabrication method of a display device according to an embodiment of the disclosure.

Figure 3A:
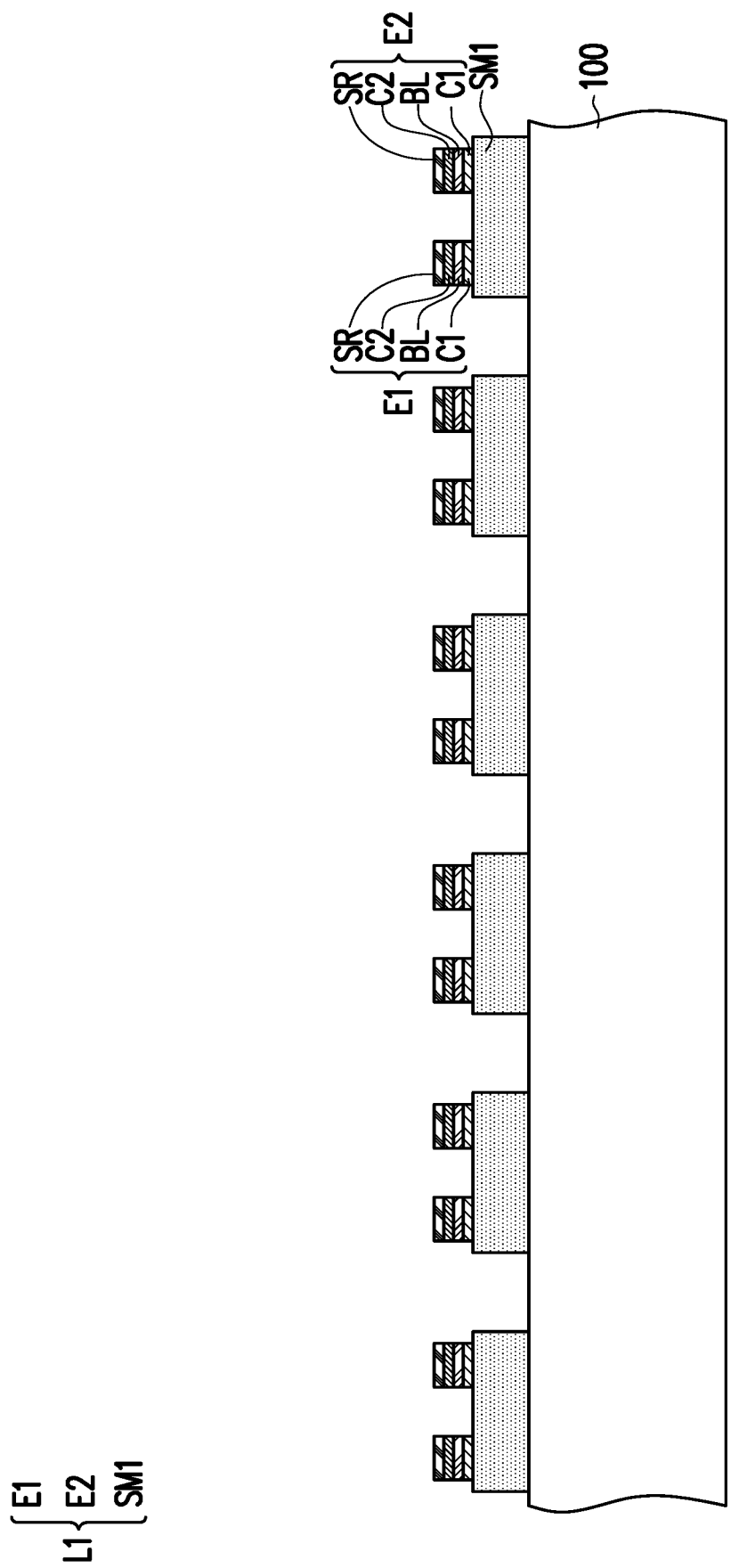
FIG. 3A to FIG. 3G are schematic cross-sectional views of a fabrication method of a display device according to an embodiment of the disclosure.

With reference to FIG. 3A, a plurality of light-emitting diodes L1 are formed on the growth substrate 100. Each light-emitting diode L1 includes a semiconductor stack layer SM1 and the two electrodes E1 and E2. The two electrodes E1 and E2 are formed on the semiconductor stack layer SM1. The structure of the light-emitting diode L1 is similar to the light-emitting diode L of FIG. 1 or the light-emitting diode La of FIG. 2. For related description, reference may be made to FIG. 1 and FIG. 2.

Figure 3B:
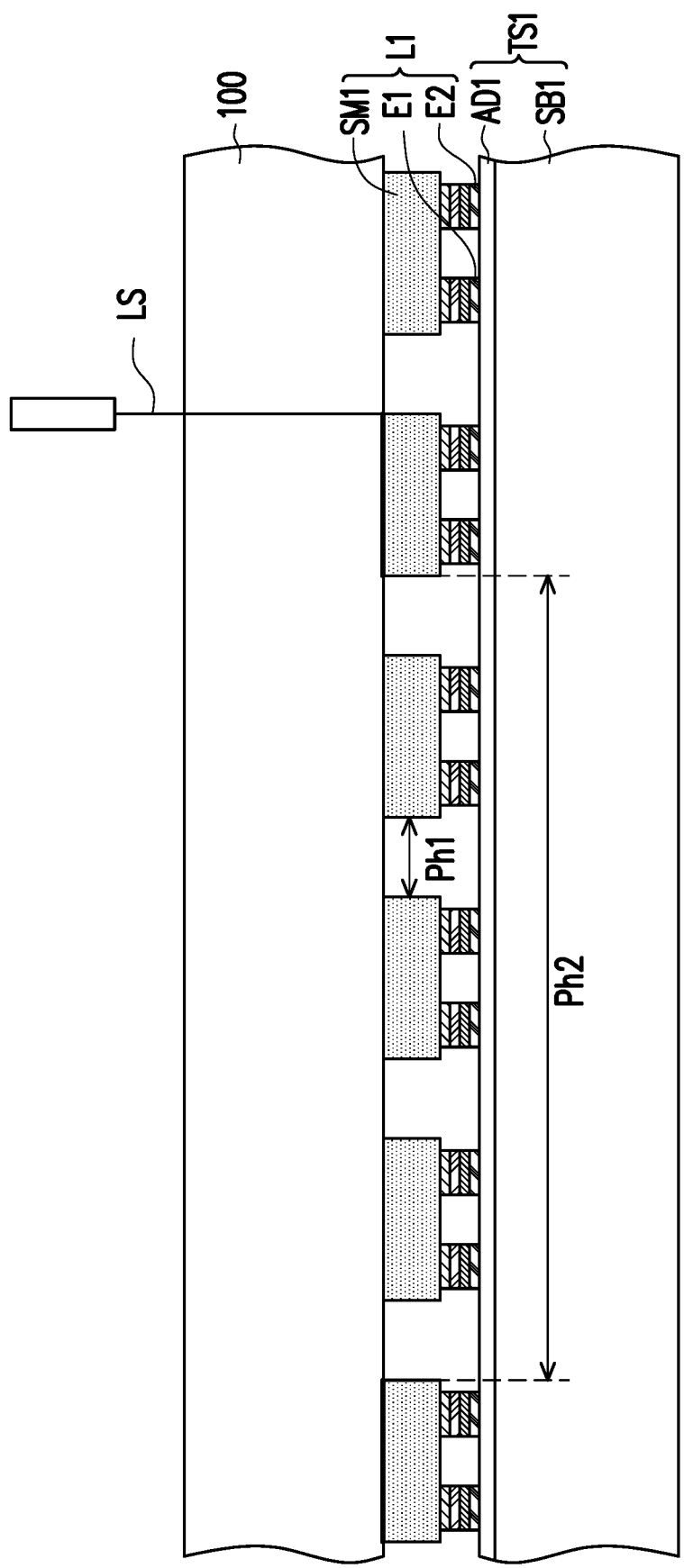

With reference to FIG. 3B, one or more light-emitting diodes L1 are transferred from the growth substrate 100 onto a first transfer substrate TS1. In this embodiment, the first transfer substrate TS1 includes a substrate SB1 and an adhesive layer AD1. In some embodiments, the first transfer substrate TS1 is a tape, and the substrate SB1 includes a soft material. In some embodiments, the first transfer substrate TS1 is a tape and does not include the substrate SB1, and the adhesive layer AD1 is not fixed on the substrate SB1 but by other supporting structures (e.g., metal rings). The substrate SB1 is a transparent substrate, and the material thereof is, for example, glass, sapphire substrate, or other suitable materials. The adhesive layer AD1 is an adhesive material, and the material thereof is, for example, tape, polymer material, or materials having viscosity. The adhesive layer AD1 may be comprehensively located on the transparent substrate or partially located on the transparent substrate (only located on the bonding places of the light-emitting diodes).

The light-emitting diode substrate 10 is pasted together with the first transfer substrate TS1, and the light-emitting diode L1 on the growth substrate 100 is made to face toward the first transfer substrate TS1. Then, by laser lift-off, one or more light-emitting diodes L1 are transferred from the growth substrate 100 onto the adhesive layer AD1 of the first transfer substrate TS1.

In this embodiment, the light-emitting diode L1 to be transferred is peeled off with a laser LS, and a distance between the light-emitting diodes L1 on the first transfer substrate TS1 is adjusted. In FIG. 3B, the bottom of the peeled-off light-emitting diodes L1 are illustrated by thick lines. In this embodiment, a distance Ph2 between the light-emitting diodes L1 on the first transfer substrate TS1 is greater than a distance Ph1 between the light-emitting diodes L1 on the growth substrate 100 (i.e., the distance between the light-emitting diodes L1 after the transfer is greater than the distance before the transfer).

In this embodiment, a part of the light-emitting diodes L1 are transferred onto the first transfer substrate TS1, and the other part of the light-emitting diodes L1 remain on the growth substrate 100. In this embodiment, the electrodes E1 and E2 of the light-emitting diode L1 are located on one side of the light-emitting diode L1 facing toward the first transfer substrate TS1.

Figure 3C:
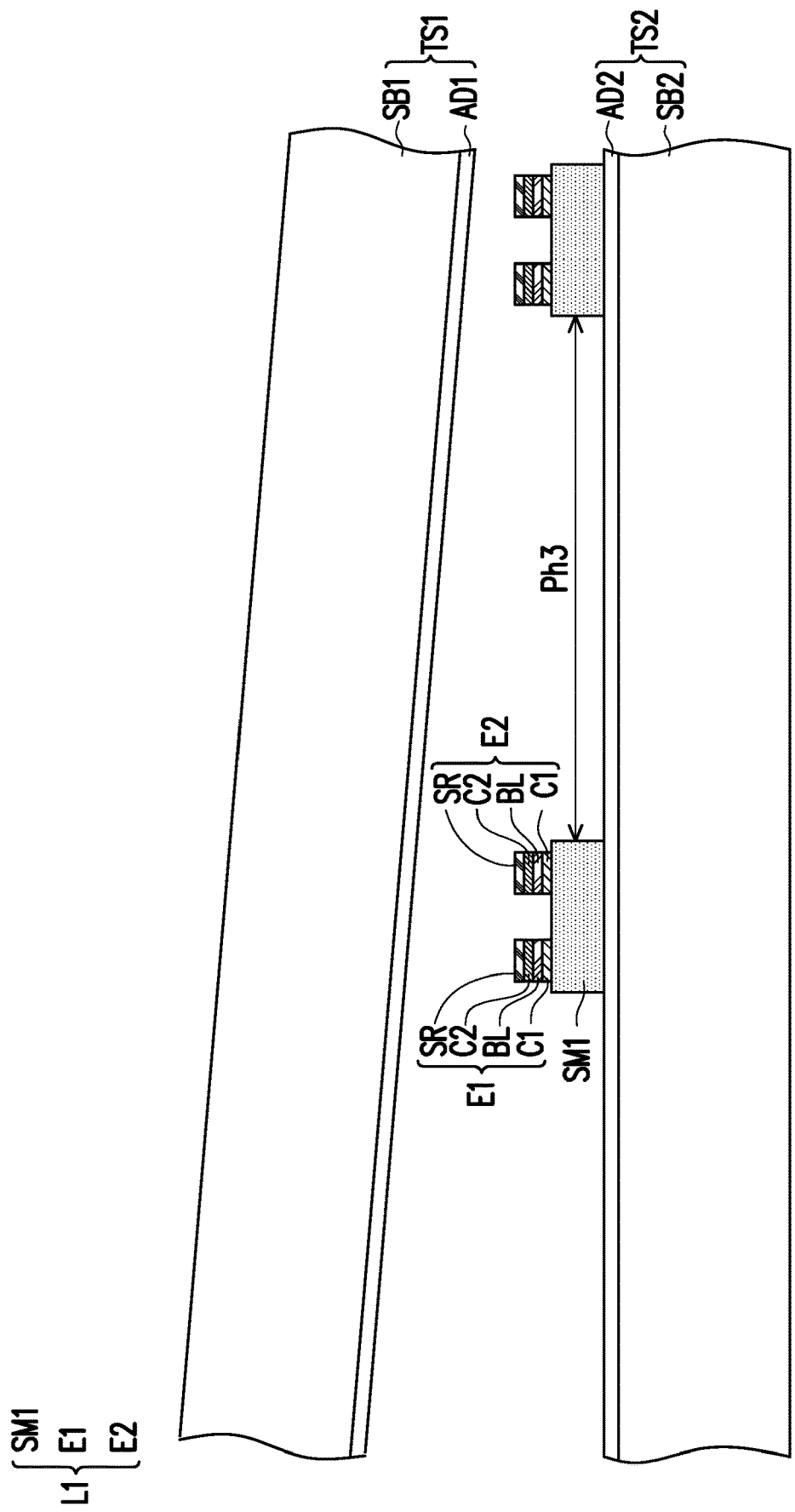

With reference to FIG. 3C, one or more of the light-emitting diodes L1 are transferred from the first transfer substrate TS1 to a second transfer substrate TS2. The second transfer substrate TS2 includes a substrate SB2 and an adhesive layer AD2. In some embodiments, the substrate SB2 includes a thermally conductive material, such as ceramic, metal, or other suitable materials. In some embodiments, the substrate SB2 includes a transparent material, such as glass, sapphire, or other suitable materials.

In this embodiment, the first transfer substrate TS1 includes tape, and a viscosity of the adhesive layer AD2 is greater than a viscosity of the adhesive layer AD1 (or the tape). After the second transfer substrate TS2 is laminated on the light-emitting diode L1 on the first transfer substrate TS1 (e.g., the second transfer substrate TS2 is moved to be in contact with the light-emitting diode L1 and/or the first transfer substrate TS1 is moved such that the second transfer substrate TS2 is in contact with the light-emitting diode L1), the first transfer substrate TS1 is removed. Since the viscosity of the adhesive layer AD2 is greater than the viscosity of the adhesive layer AD1, after the first transfer substrate TS1 is removed, the light-emitting diode L1 remains on the second transfer substrate TS2.

In other embodiments, the substrate SB1 of the first transfer substrate TS1 is a transparent substrate. The first transfer substrate TS1 or the second transfer substrate TS2 is moved such that the first transfer substrate TS1 is overlapped with the second transfer substrate TS2. Then, the light-emitting diode L1 is irradiated by a laser from one side of the substrate SB1. Moreover, by laser lift-off, the light-emitting diode L1 is transferred from the first transfer substrate TS1 onto the adhesive layer AD2 of the second transfer substrate TS2.

In this embodiment, a distance Ph3 between the light-emitting diodes L1 on the second transfer substrate TS2 is approximately equal to the distance Ph2 between the light-emitting diodes L1 on the first transfer substrate TS1. In this embodiment, the electrodes E1 and E2 of the light-emitting diode L1 are located on one side of the light-emitting diode L1 facing away from the second transfer substrate TS2.

Figure 3D:
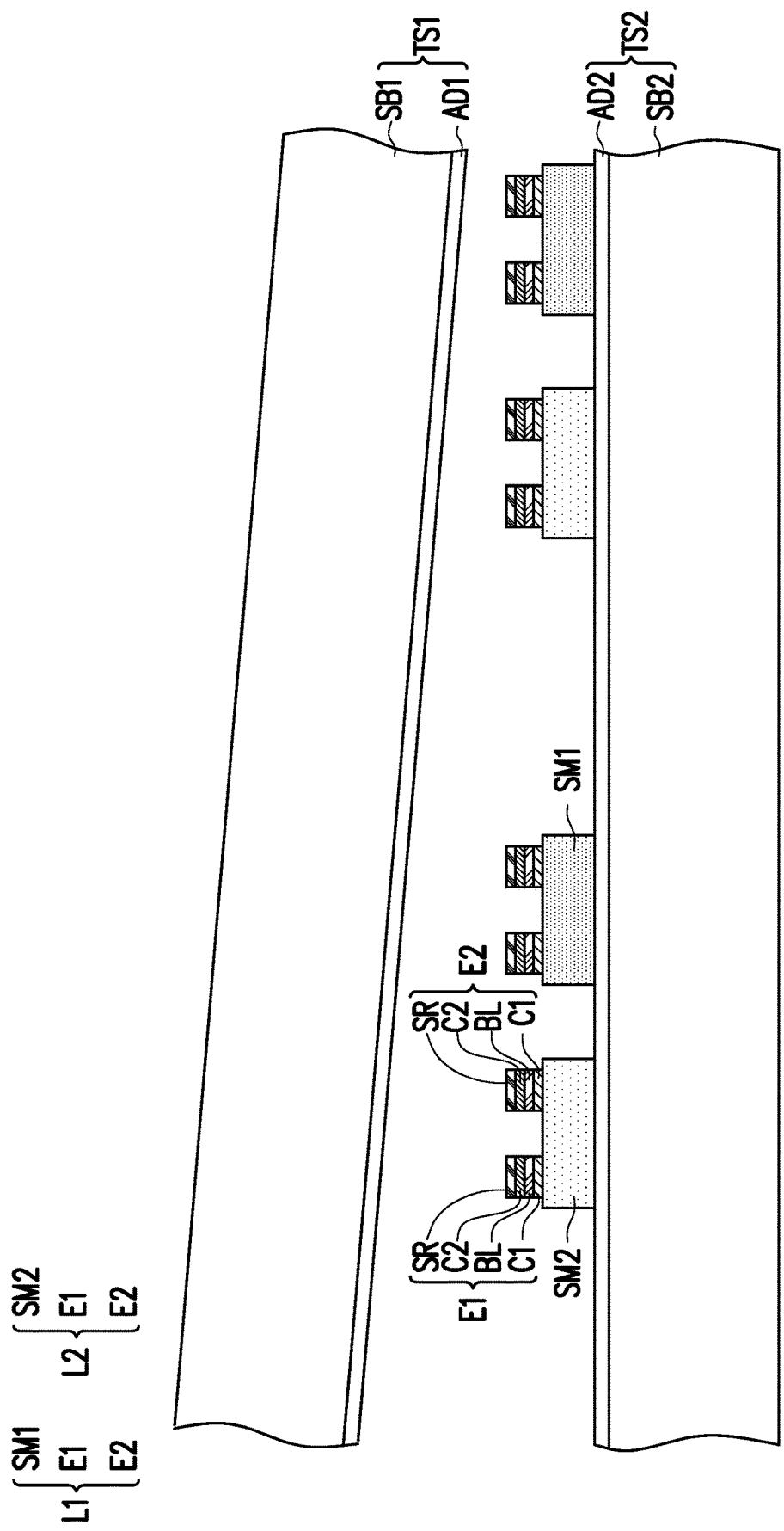

With reference to FIG. 3D, one or more light-emitting diodes L2 are moved onto the second transfer substrate TS2 in a way similar to that of FIG. 3A to FIG. 3C. The light-emitting diode L2 includes a semiconductor stack layer SM2 and the electrodes E1 and E2. The structure of the light-emitting diode L2 is similar to the light-emitting diode L of FIG. 1 or the light-emitting diode La of FIG. 2. For related description, reference may be made to FIG. 1 and FIG. 2.

Figure 3E:
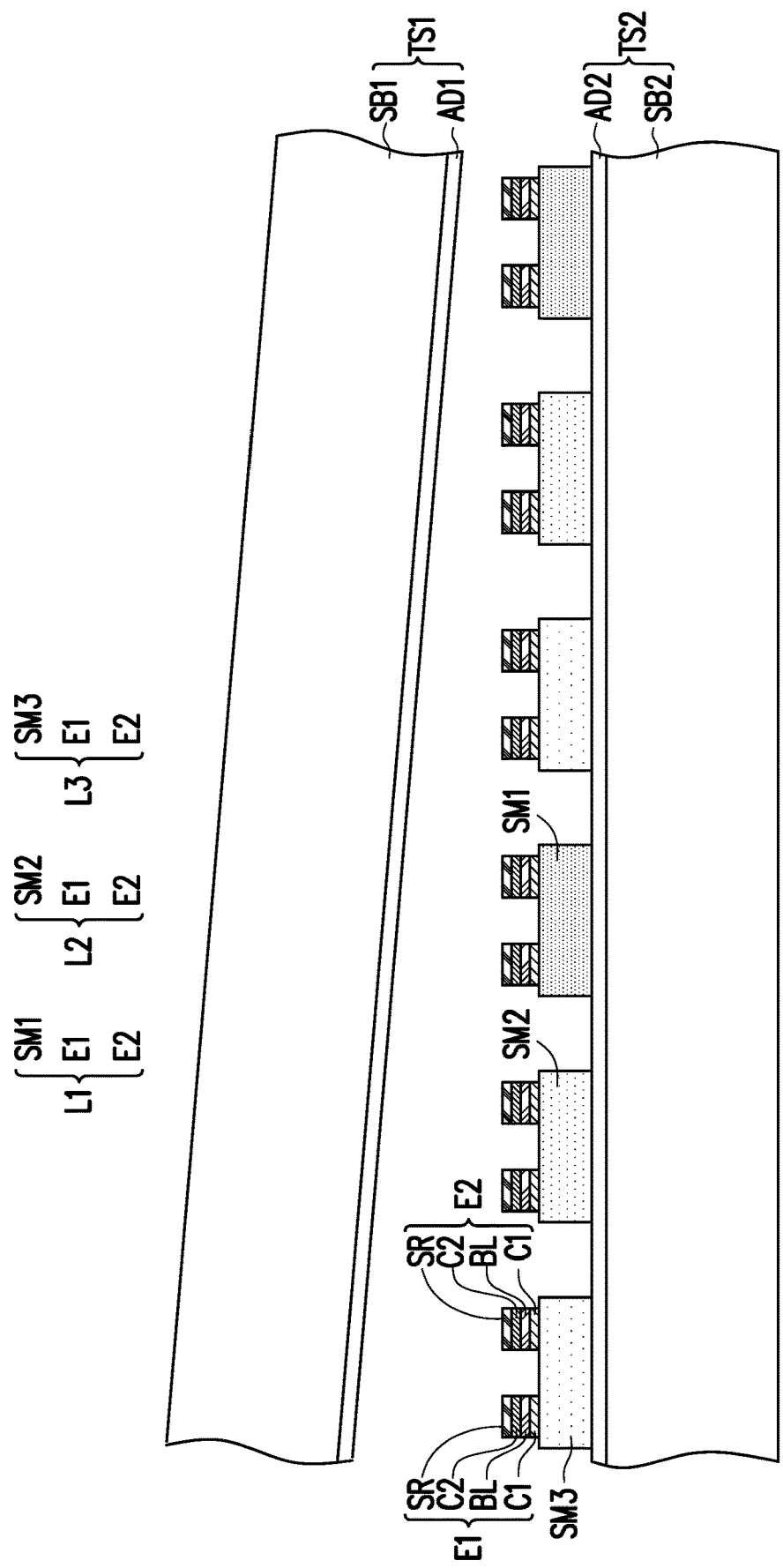

With reference to FIG. 3E, one or more light-emitting diodes L3 are moved onto the second transfer substrate TS2 in a way similar to that of FIG. 3A to FIG. 3C. The light-emitting diode L3 includes a semiconductor stack layer SM3 and the electrodes E1 and E2. The structure of the light-emitting diode L3 is similar to the light-emitting diode L of FIG. 1 or the light-emitting diode La of FIG. 2. For related description, reference may be made to FIG. 1 and FIG. 2.

In this embodiment, the light-emitting diode L1, the light-emitting diode L2, and the light-emitting diode L3 are respectively a blue light-emitting diode, a green light-emitting diode, and a red light-emitting diode. In this embodiment, the light-emitting diode L1, the light-emitting diode L2, and the light-emitting diode L3 are sequentially transferred onto the second transfer substrate TS2. Nonetheless, the disclosure does not limit the sequence in which the light-emitting diode L1, the light-emitting diode L2, and the light-emitting diode L3 are transferred onto the second transfer substrate TS2. The sequence in which the light-emitting diode L1, the light-emitting diode L2, and the light-emitting diode L3 are transferred onto the second transfer substrate TS2 may be adjusted depending on actual requirements.

Figure 3F:
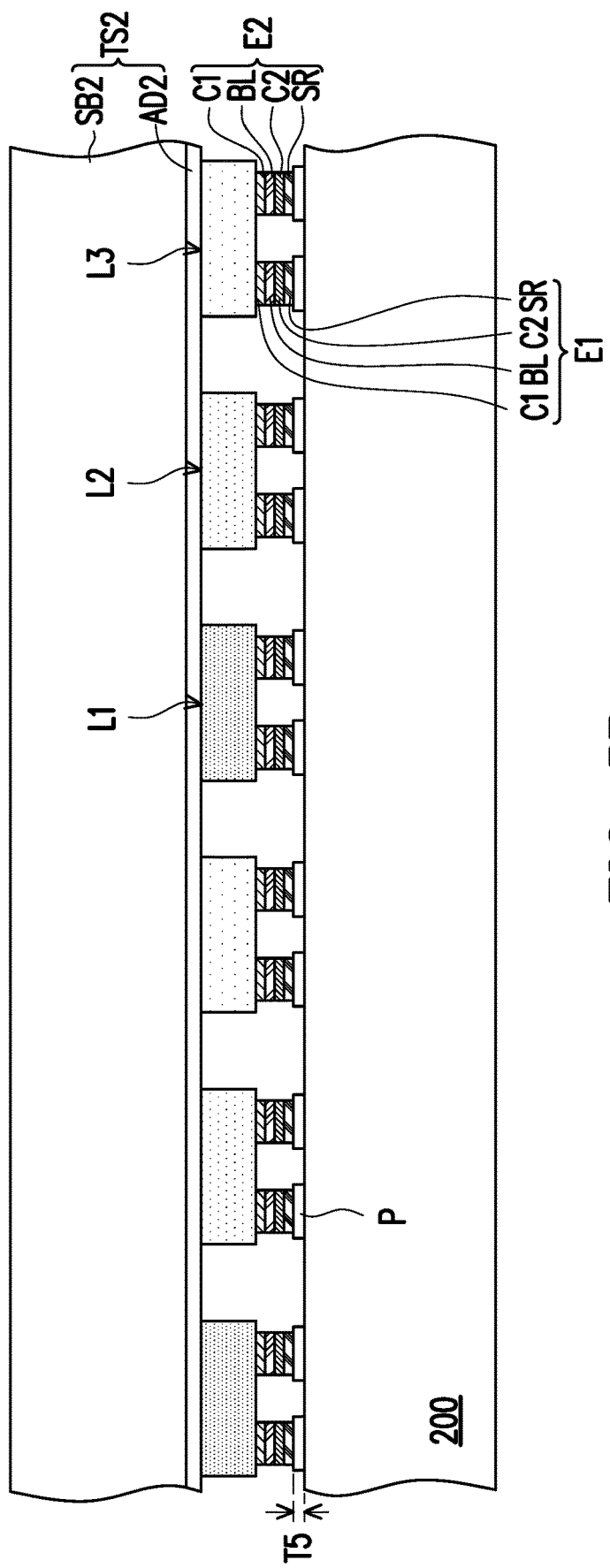

With reference to FIG. 3F, the light-emitting diodes L1, L2, and L3 are transferred from the second transfer substrate TS2 to a circuit substrate 200. In this embodiment, the distance between the light-emitting diodes L1, L2, and L3 on the second transfer substrate TS2 is approximately equal to the distance between the light-emitting diodes L1, L2, and L3 on the circuit substrate 200. The circuit substrate 200 is a rigid substrate or a flexible substrate. The circuit substrate 200 includes, for example, glass, printed circuit board, polyimide, silicon substrate, or the like. In the disclosure, the light-emitting diode L1, the light-emitting diode L2, and the light-emitting diode L3 are not limited to being transferred from the same second transfer substrate TS2 onto the circuit substrate 200 at the same time. In other embodiments, the light-emitting diode L1, the light-emitting diode L2, and the light-emitting diode L3 may also be transferred from the respective second transfer substrates TS2 onto the circuit substrate 200.

In this embodiment, the circuit substrate 200 includes a plurality of pads P. The position of each of the light-emitting diodes L1, L2, and L3 corresponds to two pads P of the circuit substrate 200. In some embodiments, the pads P are electrically connected to active elements (not shown) or signal lines (not shown) in the circuit substrate 200. In some embodiments, other additional driving chips (e.g., micro chips) or drive circuit boards are bonded on the circuit substrate 200. In some embodiments, the circuit substrate 200 is adapted for use in a display panel or a backlight module.

In some embodiments, a material selected for the pads P includes gold, nickel, copper, tin, indium, tin-silver mixed metal, tin-copper mixed metal, tin-silver-copper mixed metal, or a combination or a stack of the above materials. In some embodiments, a thickness T5 of the pads P is not greater than 8 µm, thereby reducing the possibility that the pads P is susceptible to damage due to stress.

In some embodiments, the substrate SB2 of the second transfer substrate TS2 includes a thermally conductive material. The second transfer substrate TS2 is pressed on the circuit substrate 200. Then, heat is transferred through the second transfer substrate TS2 to the light-emitting diodes L1, L2, and L3 to heat the light-emitting diodes L1, L2, and L3. The metal layers SR in the electrodes E1 and E2 of the light-emitting diodes L1, L2, and L3 are respectively connected to the corresponding pads P of the circuit substrate 200.

In some embodiments, the substrate SB2 includes a transparent material, such as glass, sapphire, or other suitable materials. The second transfer substrate TS2 is pressed on the circuit substrate 200. Then, the light-emitting diodes L1, L2, and L3 are irradiated by a laser through the substrate SB2 to heat the light-emitting diodes L1, L2, and L3. The metal layers SR in the electrodes E1 and E2 of the light-emitting diodes L1, L2, and L3 are respectively connected to the corresponding pads P of the circuit substrate 200.

In some embodiment, the material selected for the pads P includes a material with improved eutectic bonding with the metal layer SR. After the light-emitting diodes L1, L2, and L3 are heated, the metal layer SR is eutectically bonded to the pads P, and the metal layer SR electrically connects to the barrier layer BL to the corresponding pads P.

Figure 3G:
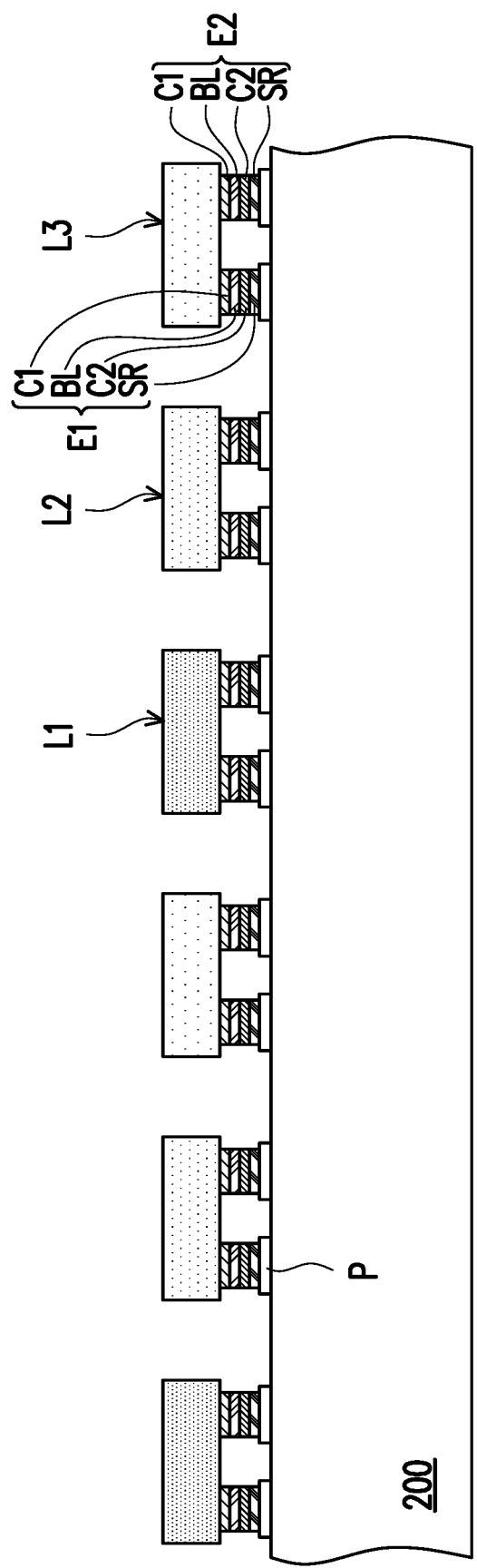

With reference to FIG. 3G, the second transfer substrate TS2 is removed. In this embodiment, the light-emitting diodes L1, L2, and L3 include light-emitting diodes of different colors (e.g., blue, green, and red), but the disclosure is not limited thereto. In other embodiment, only the light-emitting diode L1 of a single color is transferred to the circuit substrate 200, and light emitted by the light-emitting diode L1 is converted into light of other colors through other color conversion elements (e.g., a quantum dot material, a phosphor material, or the like). In other words, in other embodiments, the steps of forming the light-emitting diodes L2 and L3 and transferring the light-emitting diodes L2 and L3 may be omitted.

Based on the above, the barrier layer BL shields metal elements in the metal layer SR from being diffused to the first conductive layer C1, thereby preventing that intermetallic compounds are not generated from reaction because of adversely affected adhesion between the metal layer SR and the first conductive layer C1, resulting in cracks between the metal layer SR and the first conductive layer C1. In this way, connection between the light-emitting diodes L1, L2, and L3 and the pads P is improved. In addition, since the electrodes E1 and E2 of the light-emitting diodes L1, L2, and L3 include the metal layer SR, the light-emitting diodes L1, L2, and L3 may be bonded to the circuit substrate 200 without disposing solder balls or conductive glue on the circuit substrate 200.

FIG. 4A to FIG. 4D are schematic cross-sectional views of a fabrication method of a display device according to an embodiment of the disclosure.

Figure 4A:
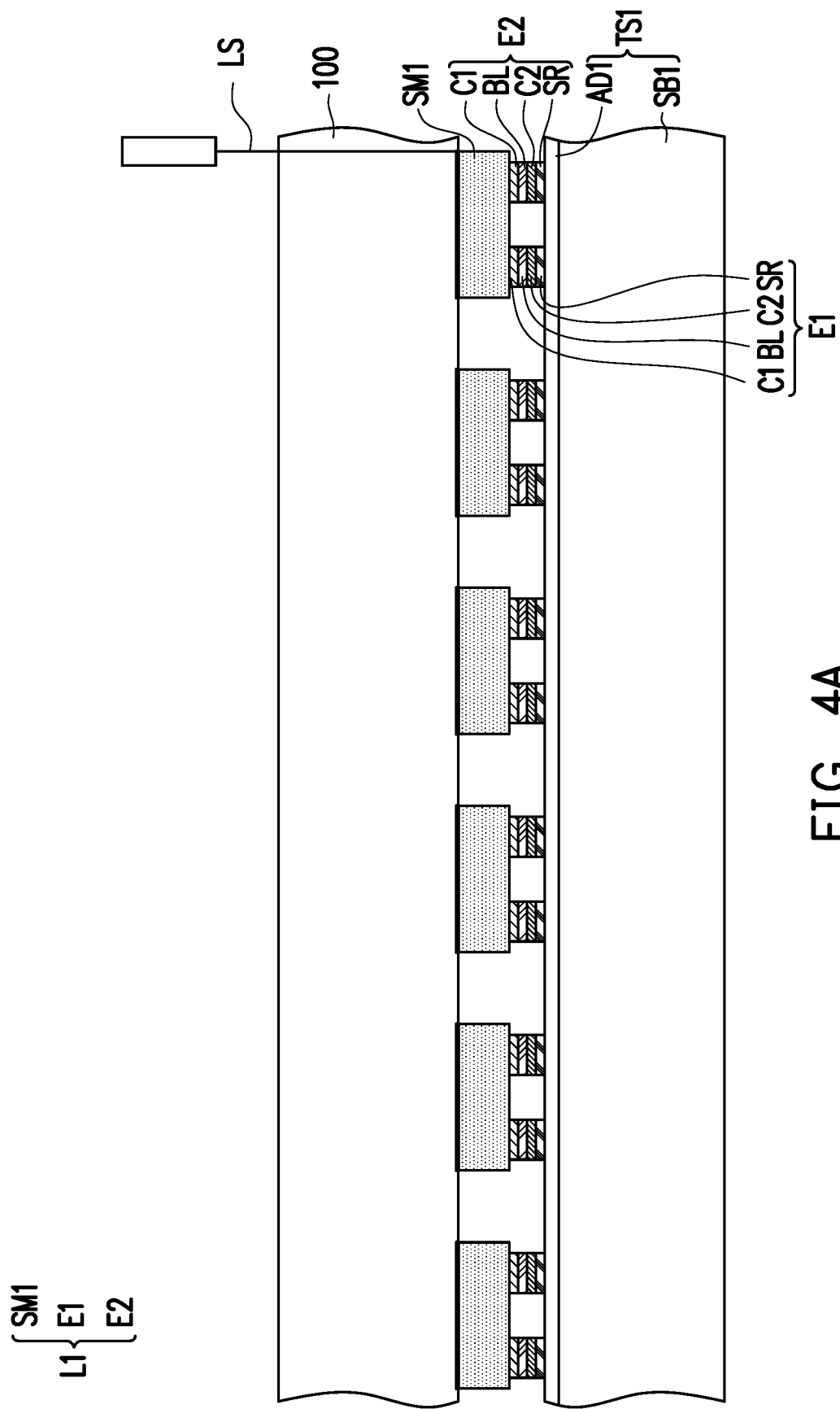
FIG. 4A to FIG. 4D are schematic cross-sectional views of a fabrication method of a display device according to an embodiment of the disclosure.

With reference to FIG. 4A, after the light-emitting diodes L1 are formed on the growth substrate 100 (as shown in FIG. 3A), the light-emitting diodes L1 on the growth substrate 100 are transferred from the growth substrate 100 to the first transfer substrate TS1.

In this embodiment, the first transfer substrate TS1 includes the substrate SB1 and the adhesive layer AD1. In this embodiment, the substrate SB1 is a transparent substrate, and the material thereof is, for example, glass, sapphire, or other suitable materials. The growth substrate 100 is moved onto the first transfer substrate TS1, and the light-emitting diodes L1 on the growth substrate 100 is made to face toward the first transfer substrate TS1. Then, by laser lift-off, the light-emitting diodes L1 are transferred from the growth substrate 100 onto the adhesive layer AD1 of the first transfer substrate TS1.

In this embodiment, the distance between the light-emitting diodes L1 on the first transfer substrate TS1 is approximately equal to the distance between the light-emitting diodes L1 on the growth substrate 100 (i.e., the distance between the light-emitting diodes L1 after the transfer is approximately equal to the distance before the transfer).

In this embodiment, the electrodes E1 and E2 of the light-emitting diode L1 are located on one side of the light-emitting diode L1 facing toward the first transfer substrate TS1.

Figure 4B:
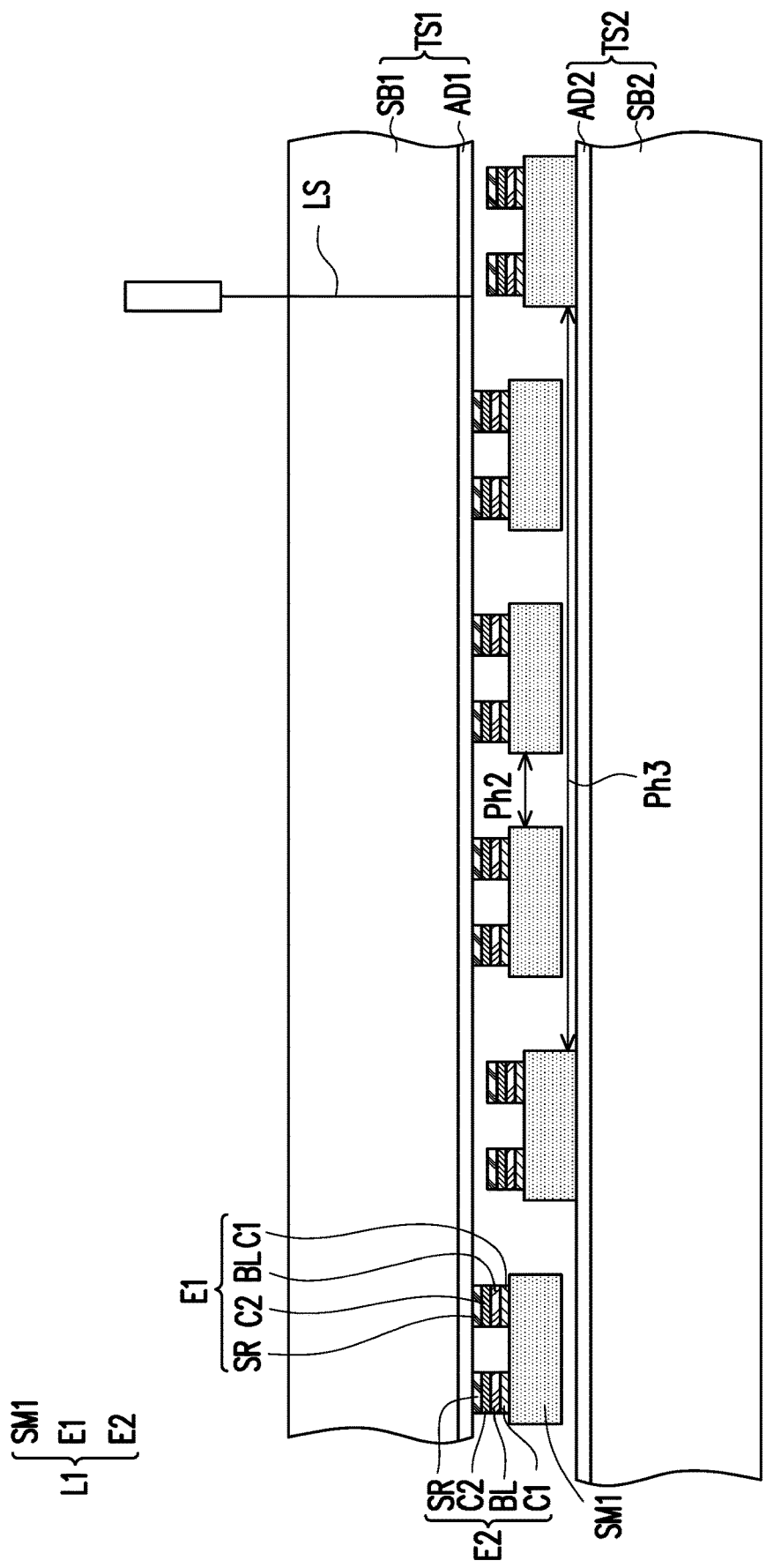

With reference to FIG. 4B, one or more light-emitting diodes L1 are transferred from the first transfer substrate TS1 to the second transfer substrate TS2. The second transfer substrate TS2 includes the substrate SB2 and the adhesive layer AD2. In some embodiments, the substrate SB2 includes a thermally conductive material, such as ceramic, metal, or other suitable materials. In some embodiments, the substrate SB2 includes a transparent material, such as glass, sapphire, or other suitable materials.

In this embodiment, the substrate SB1 of the first transfer substrate TS1 is a transparent substrate. The first transfer substrate TS1 or the second transfer substrate TS2 is moved to align the first transfer substrate TS1 with the second transfer substrate TS2. Then, the light-emitting diode L1 is irradiated by the laser LS from one side of the substrate SB1. In addition, by laser transfer, the light-emitting diode L1 is transferred from the first transfer substrate TS1 onto the adhesive layer AD2 of the second transfer substrate TS2.

In this embodiment, the plurality of light-emitting diodes L1 to be transferred are selected with the laser LS. The distance Ph3 is present between the transferred light-emitting diodes L1. In this embodiment, the distance Ph3 between the light-emitting diodes L1 on the second transfer substrate TS2 is greater than the distance Ph2 between the light-emitting diodes L1 on the first transfer substrate TS1 (i.e., the distance between the light-emitting diodes L1 after the transfer is greater than the distance before the transfer).

In this embodiment, the electrodes E1 and E2 of the light-emitting diode L1 are located on one side of the light-emitting diode L1 facing away from the second transfer substrate TS2.

Figure 4C:
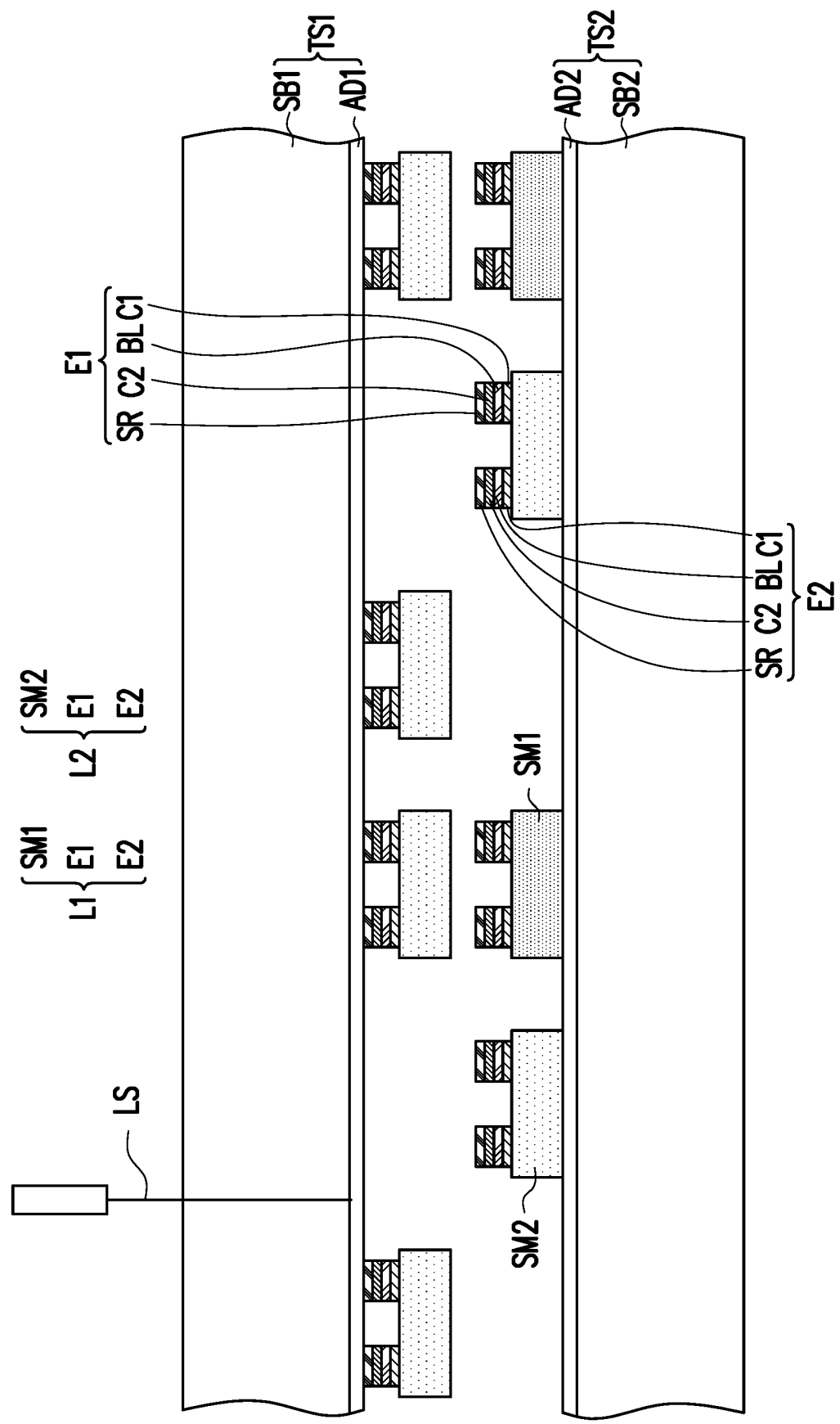

With reference to FIG. 4C, one or more light-emitting diodes L2 are moved onto the second transfer substrate TS2 in a way similar to that of FIG. 4A and FIG. 4B. The light-emitting diode L2 includes the semiconductor stack layer SM2 and the electrodes E1 and E2. The structure of the light-emitting diode L2 is similar to the light-emitting diode L of FIG. 1 or the light-emitting diode La of FIG. 2. For related description, reference may be made to FIG. 1 and FIG. 2.

Figure 4D:
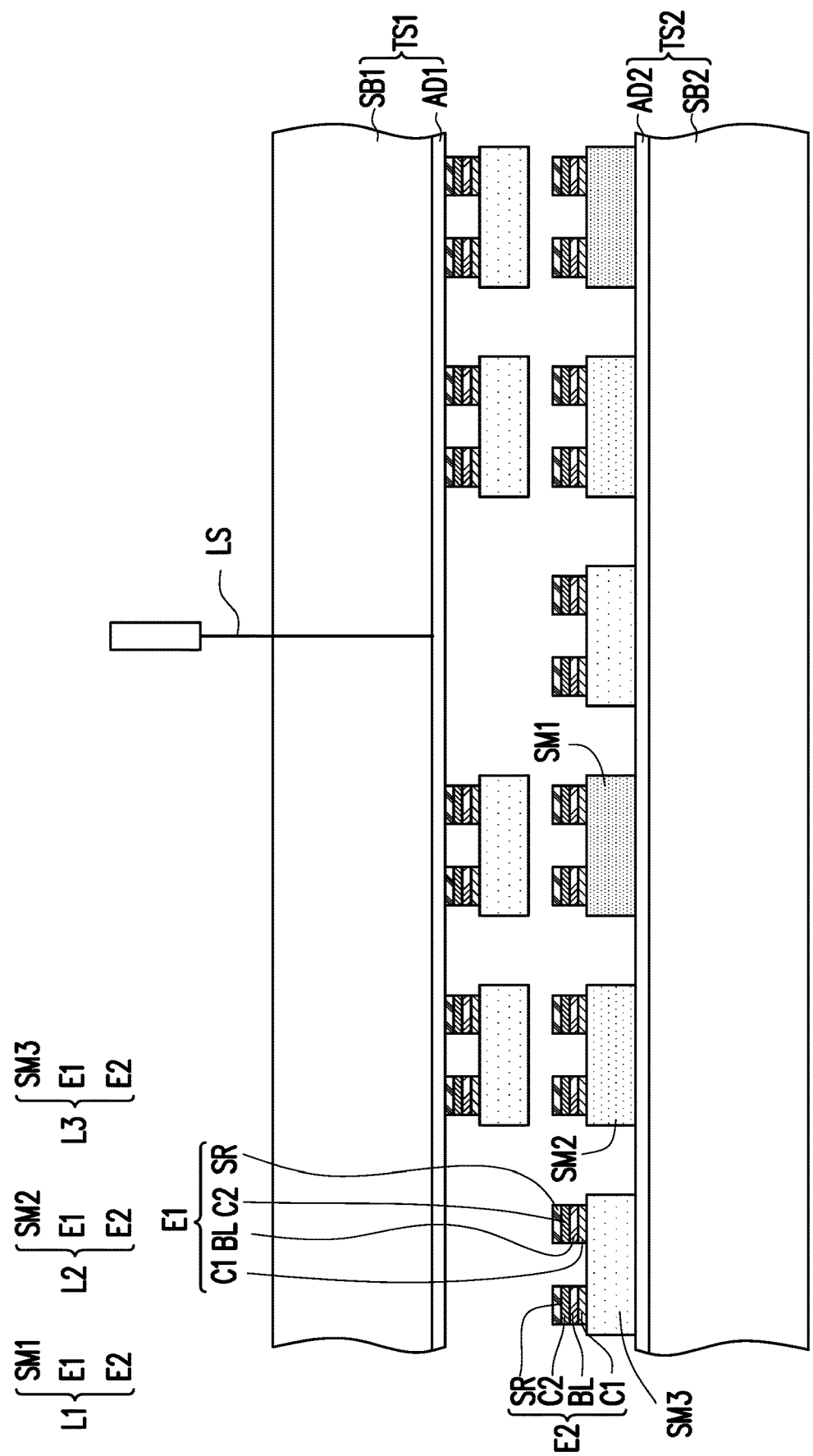

With reference to FIG. 4D, one or more light-emitting diodes L3 are moved onto the second transfer substrate TS2 in a way similar to that of FIG. 4A and FIG. 4B. The light-emitting diode L3 includes the semiconductor stack layer SM3 and the electrodes E1 and E2. The structure of the light-emitting diode L3 is similar to the light-emitting diode L of FIG. 1 or the light-emitting diode La of FIG. 2. For related description, reference may be made to FIG. 1 and FIG. 2.

In this embodiment, the light-emitting diode L1, the light-emitting diode L2, and the light-emitting diode L3 are respectively a blue light-emitting diode, a green light-emitting diode, and a red light-emitting diode. In this embodiment, the light-emitting diode L1, the light-emitting diode L2, and the light-emitting diode L3 are sequentially transferred onto the second transfer substrate TS2. Nonetheless, the disclosure does not limit the sequence in which the light-emitting diode L1, the light-emitting diode L2, and the light-emitting diode L3 are transferred onto the second transfer substrate TS2. The sequence in which the light-emitting diode L1, the light-emitting diode L2, and the light-emitting diode L3 are transferred onto the second transfer substrate TS2 may be adjusted depending on actual requirements.

After the light-emitting diodes L1, L2, and L3 are transferred onto the second transfer substrate TS2, the light-emitting diodes L1, L2, and L3 are bonded to the circuit substrate 200 through a process similar to that of FIG. 3F and FIG. 3G. For related description, reference may be made to the paragraphs relevant to FIG. 3F and FIG. 3G, which is not repeated herein.

Based on the above, the barrier layer BL shields metal elements in the metal layer SR from being diffused to the first conductive layer C1, thereby preventing that intermetallic compounds are not generated from reaction because of adversely affected adhesion between the metal layer SR and the first conductive layer C1, resulting in cracks between the metal layer SR and the first conductive layer C1. In this way, connection between the light-emitting diodes L1, L2, and L3 and the pads P is improved.

FIG. 5A to FIG. 5E are schematic cross-sectional views of a fabrication method of a display device according to an embodiment of the disclosure.

Figure 5A:
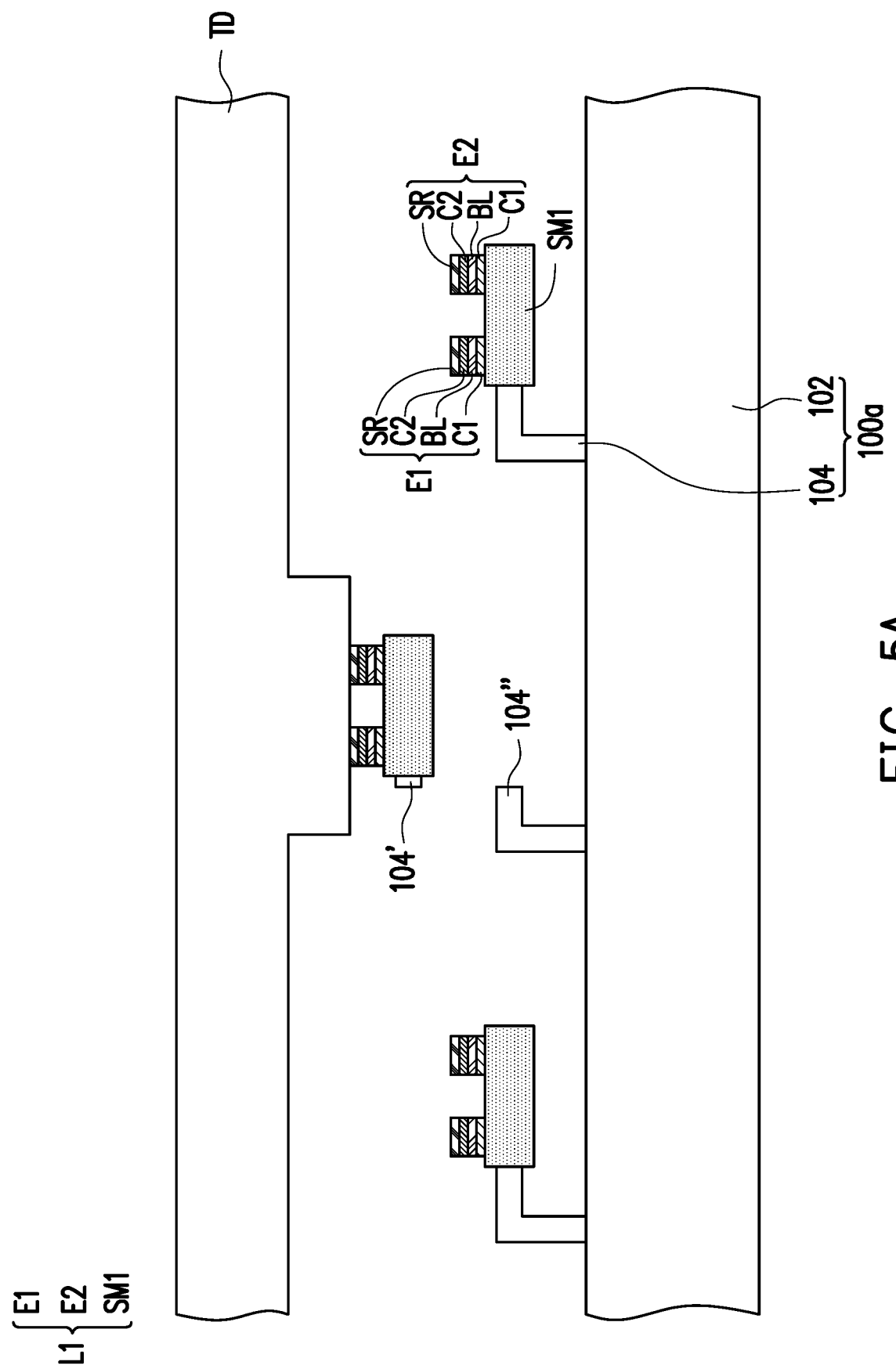
FIG. 5A to FIG. 5E are schematic cross-sectional views of a fabrication method of a display device according to an embodiment of the disclosure.

With reference to FIG. 5A, multiple light-emitting diodes L1 are formed on a growth substrate 100a. In this embodiment, the growth substrate 100a includes a substrate 102 and a tether structure 104. In some embodiments, a sacrificial layer (not shown) and the tether structure 104 are formed on the substrate 102. Then, the light-emitting diode L1 connected to the tether structure 104 is formed. After that, the sacrificial layer is removed to form a gap between the light-emitting diode L1 and the substrate 102. After the sacrificial layer is removed, the light-emitting diode L1 is fixed on the tether structure 104 on the growth substrate 100a.

In this embodiment, each of the light-emitting diodes L1 includes the semiconductor stack layer SM1 and the two electrodes E1 and E2. The two electrodes E1 and E2 are formed on the semiconductor stack layer SM1. The structure of the light-emitting diodes L1 is similar to the light-emitting diode L of FIG. 1 or the light-emitting diode La of FIG. 2. For related description, reference may be made to FIG. 1 and FIG. 2.

In this embodiment, the electrodes E1 and E2 of the light-emitting diode L1 are located on one side of the light-emitting diode L1 facing away from the substrate 102.

One or more light-emitting diodes L1 are lifted with a transfer device TD. When the light-emitting diode L1 is lifted from the growth substrate 100a, the tether structure 104 is broken by force. In some embodiments, a partially broken tether structure 104' remains on the lifted light-emitting diodes L1, and the other partially broken tether structure 104" remains on the substrate 102. Nonetheless, the disclosure is not limited thereto.

In this embodiment, the viscous material of the transfer device TD includes, for example, polydimethylsiloxane (PDMS). In addition, the transfer device TD lifts the light-emitting diode L1 by the Van der Waals force between the transfer device TD and the light-emitting diode L1. In other embodiments, the transfer device TD lifts the light-emitting diode L1 by vacuum attraction, static electricity, or the like.

Figure 5B:
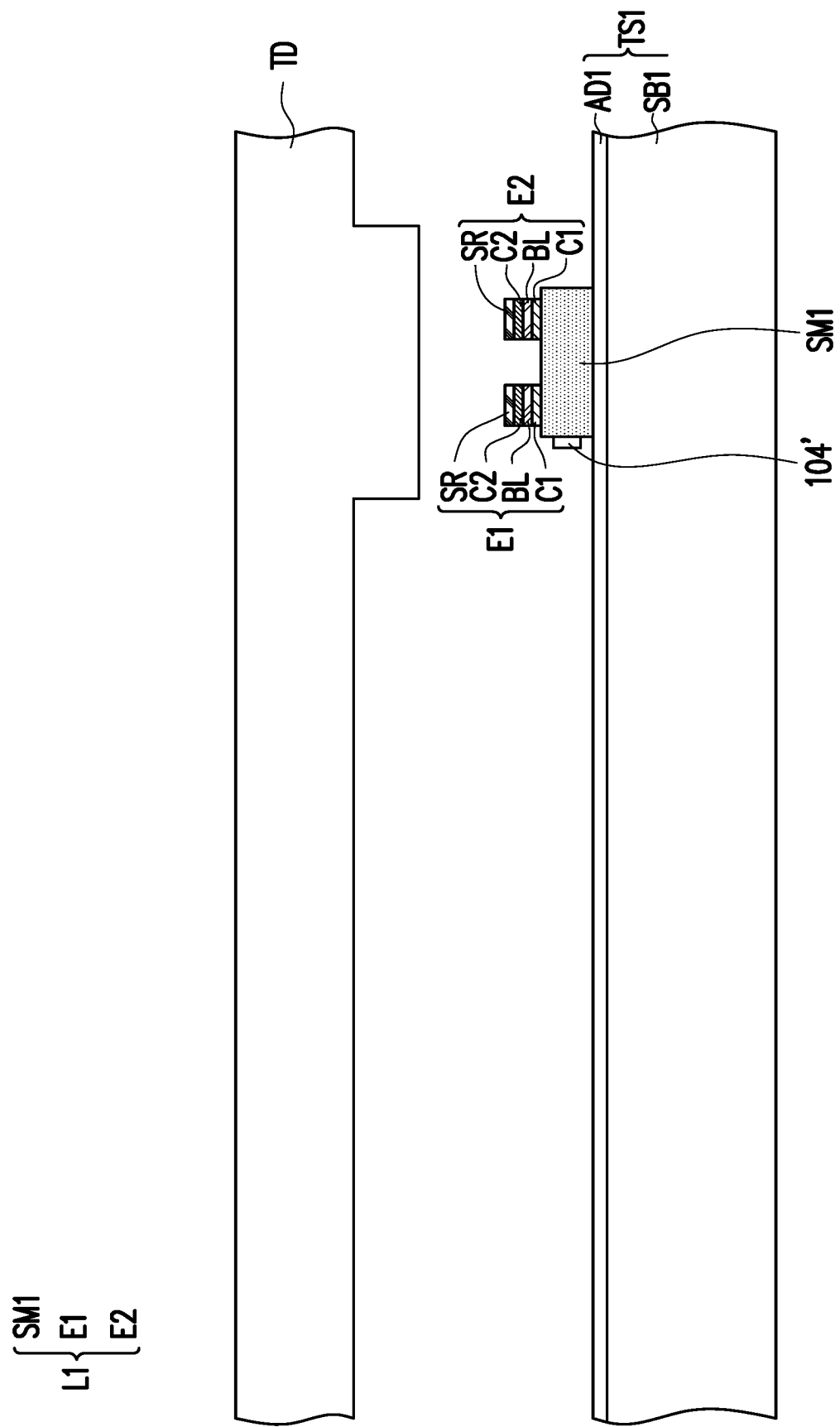

With reference to FIG. 5B, one or more light-emitting diodes L1 are transferred onto the first transfer substrate TS1 by the transfer device TD. The first transfer substrate TS1 includes the substrate SB1 and the adhesive layer AD1. In some embodiments, the substrate SB1 includes a thermally conductive material, such as ceramic, metal, or other suitable materials. In some embodiments, the substrate SB1 includes a transparent material, such as glass, sapphire, or other suitable materials.

The light-emitting diode L1 is fixed on the adhesive layer AD1 of the first transfer substrate TS1, and then the transfer device TD is removed.

In some embodiments, multiple light-emitting diodes L1 are transferred onto the first transfer substrate TS1. In addition, the distance between the light-emitting diodes L1 on the first transfer substrate TS1 is greater than the distance between the light-emitting diodes L1 on the growth substrate 100 (i.e., the distance of the light-emitting diodes L1 after the transfer is greater than the distance before the transfer).

In this embodiment, the electrodes E1 and E2 of the light-emitting diode L1 are located on one side of the light-emitting diode L1 facing away from the first transfer substrate TS1.

Figure 5C:
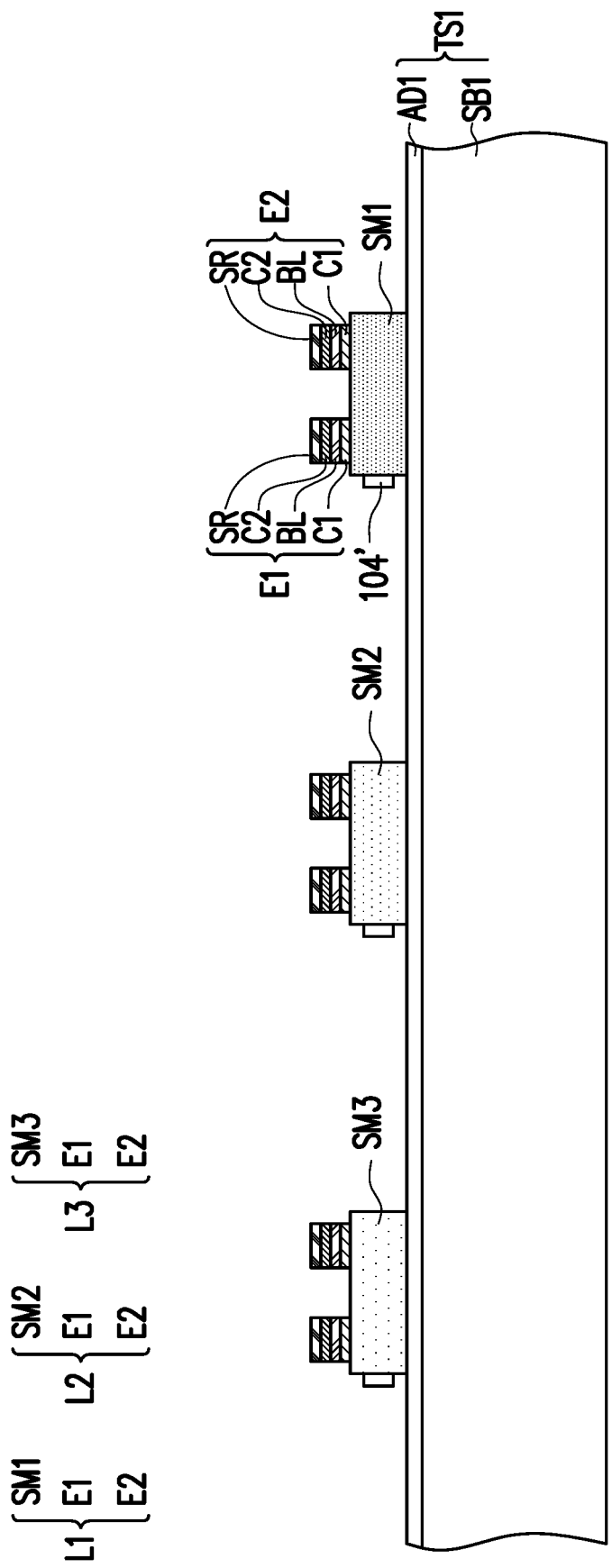

With reference to FIG. 5C, in a way similar to that of FIG. 5A to FIG. 5B, the light-emitting diodes L2 and L3 are formed, and the light-emitting diodes L2 and L3 are transferred to the first transfer substrate TS1.

Figure 5D:
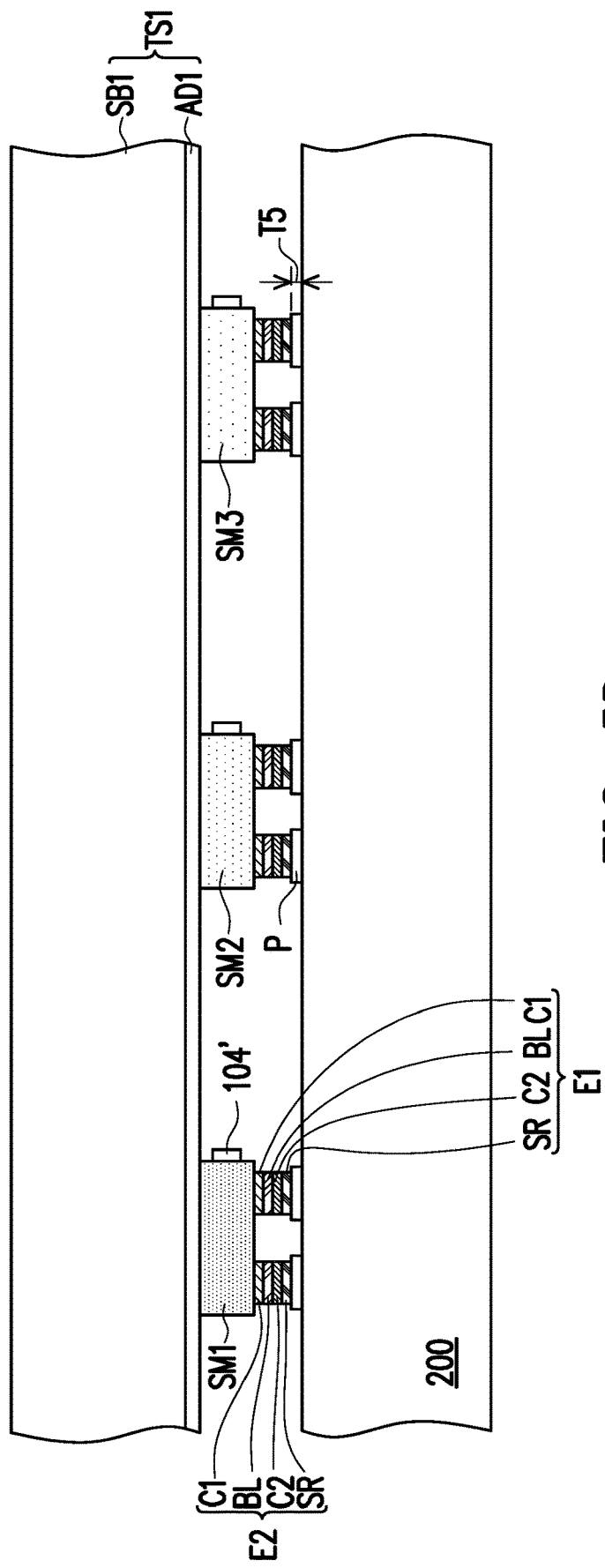

With reference to FIG. 5D, the first transfer substrate TS1 is flipped, and the light-emitting diodes L1, L2, and L3 are transferred from the first transfer substrate TS1 to the circuit substrate 200. In this embodiment, the distance between the light-emitting diodes L1, L2, and L3 on the first transfer substrate TS1 is approximately equal to the distance between the light-emitting diodes L1, L2, and L3 on the circuit substrate 200.

In this embodiment, the circuit substrate 200 includes multiple pads P. The pads P are electrically connected to active elements (not shown) or signal lines (not shown) in the circuit substrate 200. The position of each of the light-emitting diodes L1, L2, and L3 corresponds to two pads P of the circuit substrate 200.

In some embodiments, the material selected for the pads P includes gold, nickel, copper, tin, indium, tin-silver mixed metal, tin-copper mixed metal, tin-silver-copper mixed metal, or a combination of the above materials. In some embodiments, the thickness T5 of the pads P is not greater than 8 μm, thereby reducing the possibility that the pads P is susceptible to damage due to stress.

In some embodiments, the substrate SB1 of the first transfer substrate TS1 includes a thermally conductive material. The first transfer substrate TS1 is pressed on the circuit substrate 200. Then, heat is transferred through the second transfer substrate TS1 to the light-emitting diodes L1, L2, and L3 to heat the light-emitting diodes L1, L2, and L3. The metal layers SR in the electrodes E1 and E2 of the light-emitting diodes L1, L2, and L3 are respectively connected to the corresponding pads P of the circuit substrate 200.

In some embodiments, the substrate SB1 includes a transparent material, such as glass, sapphire, or other suitable materials. The first transfer substrate TS1 is pressed on the circuit substrate 200. Then, the light-emitting diodes L1, L2, and L3 are irradiated by a laser through the substrate SB1 to heat the light-emitting diodes L1, L2, and L3. The metal layers SR in the electrodes E1 and E2 of the light-emitting diodes L1, L2, and L3 are respectively connected to the corresponding pads P of the circuit substrate 200. In this embodiment, the method of heating the light-emitting diodes L1, L2, and L3 includes, for example, a single point laser, a planar laser, or a linear laser. In other embodiments, the method of heating the light-emitting diodes L1, L2, and L3 includes conductive heating.

In some embodiments, the material selected for the pads P includes a material with improved eutectic bonding with the metal layer SR. After the light-emitting diodes L1, L2, and L3 are heated, the metal layer SR is eutectically bonded to the pads P, and the metal layer SR electrically connects to the barrier layer BL to the corresponding pads P.

In this embodiment, the light-emitting diodes L1, L2, and L3 may be transferred to the circuit substrate 200 in the absence of a second transfer substrate.

Figure 5E:
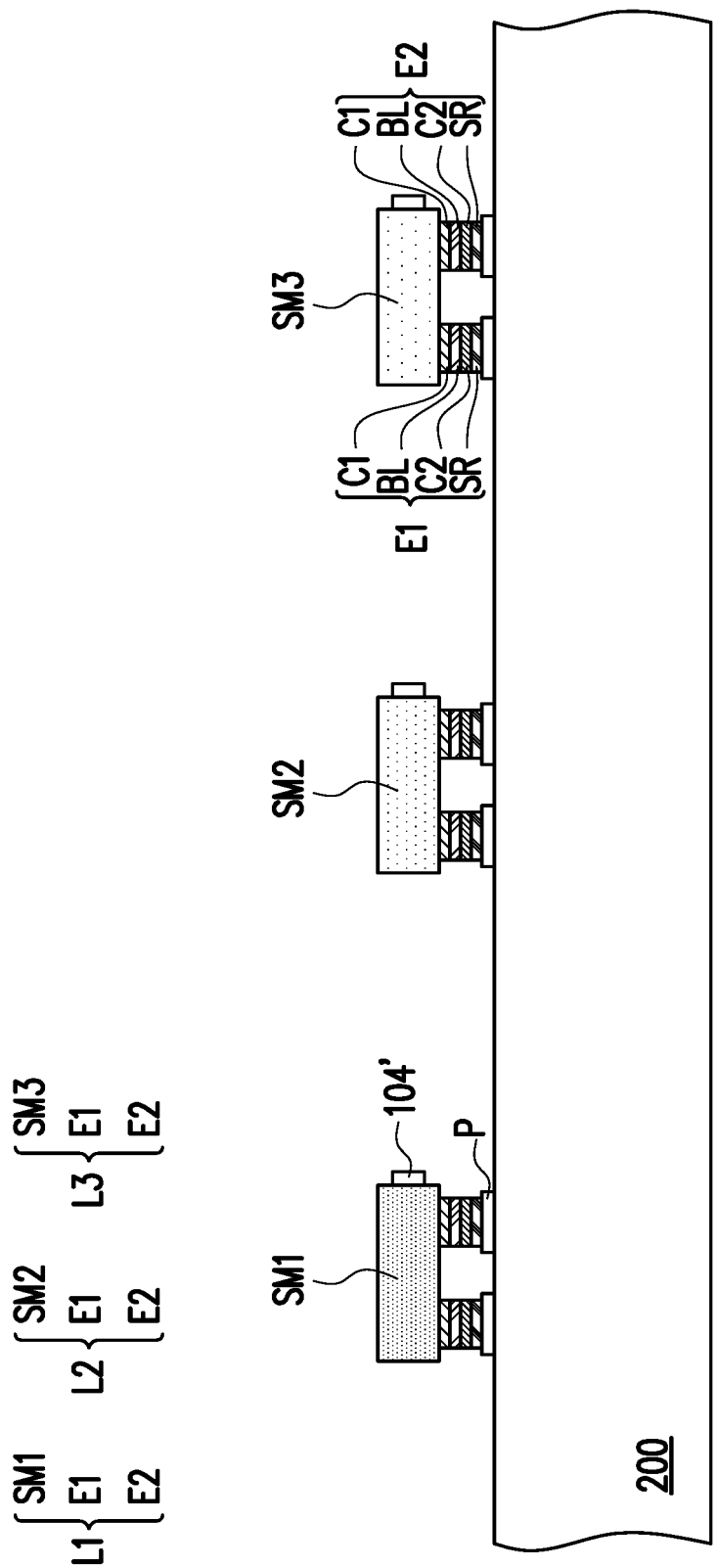

With reference to FIG. 5E, the first transfer substrate TS1 is removed.

Based on the above, the barrier layer BL shields metal elements in the metal layer SR from being diffused to the first conductive layer C1, thereby preventing that intermetallic compounds are not generated from reaction because of adversely affected adhesion between the metal layer SR and the first conductive layer C1, resulting in cracks between the metal layer SR and the first conductive layer C1. In this way, connection between the light-emitting diodes L1, L2, and L3 and the pads P is improved. In addition, since the electrodes E1 and E2 of the light-emitting diodes L1, L2, and L3 include the metal layer SR, the light-emitting diodes L1, L2, and L3 may be bonded to the circuit substrate 200 without disposing solder balls or conductive glue on the circuit substrate 200.

Figure 6B:
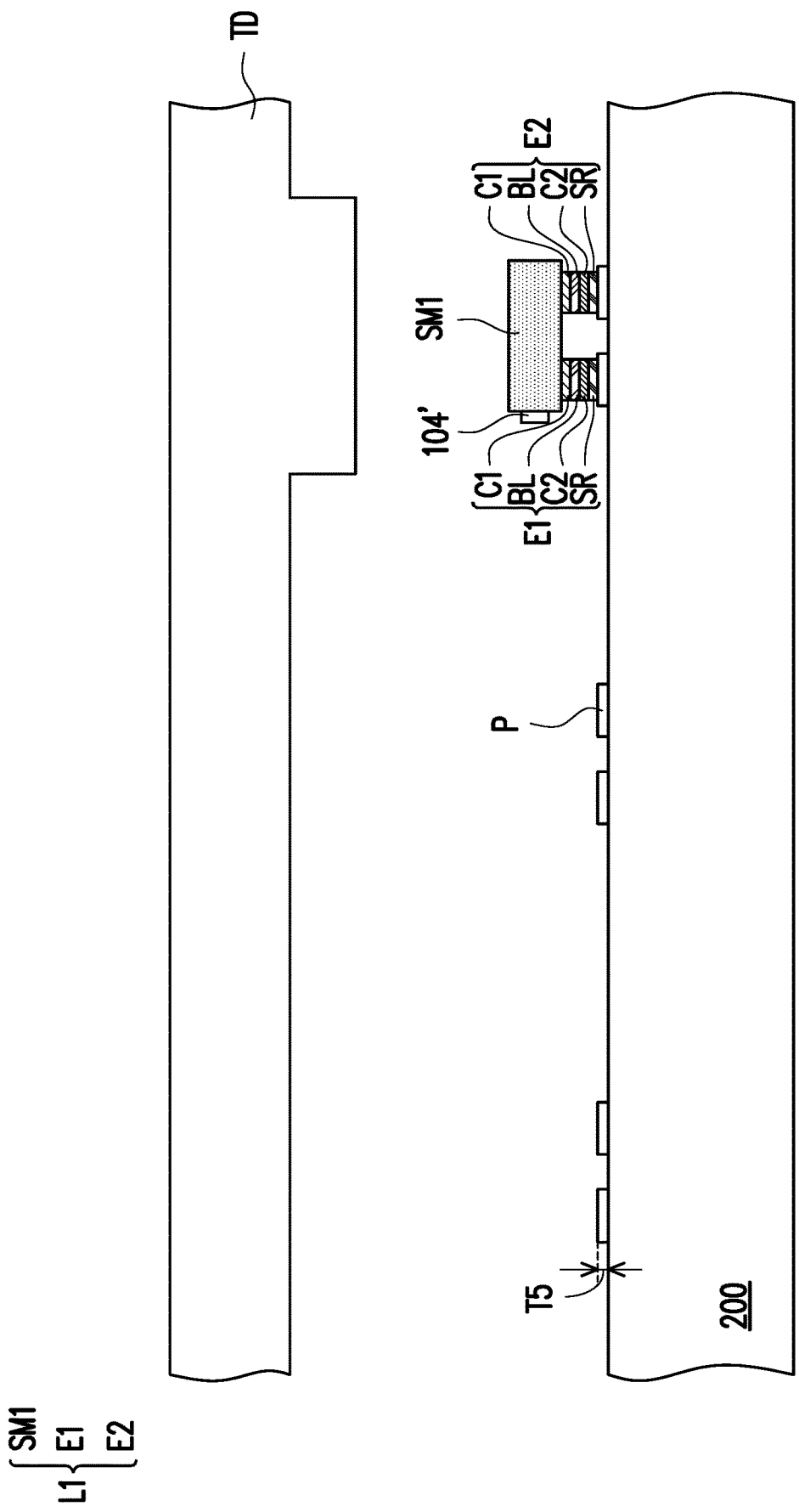
Figure 6C:
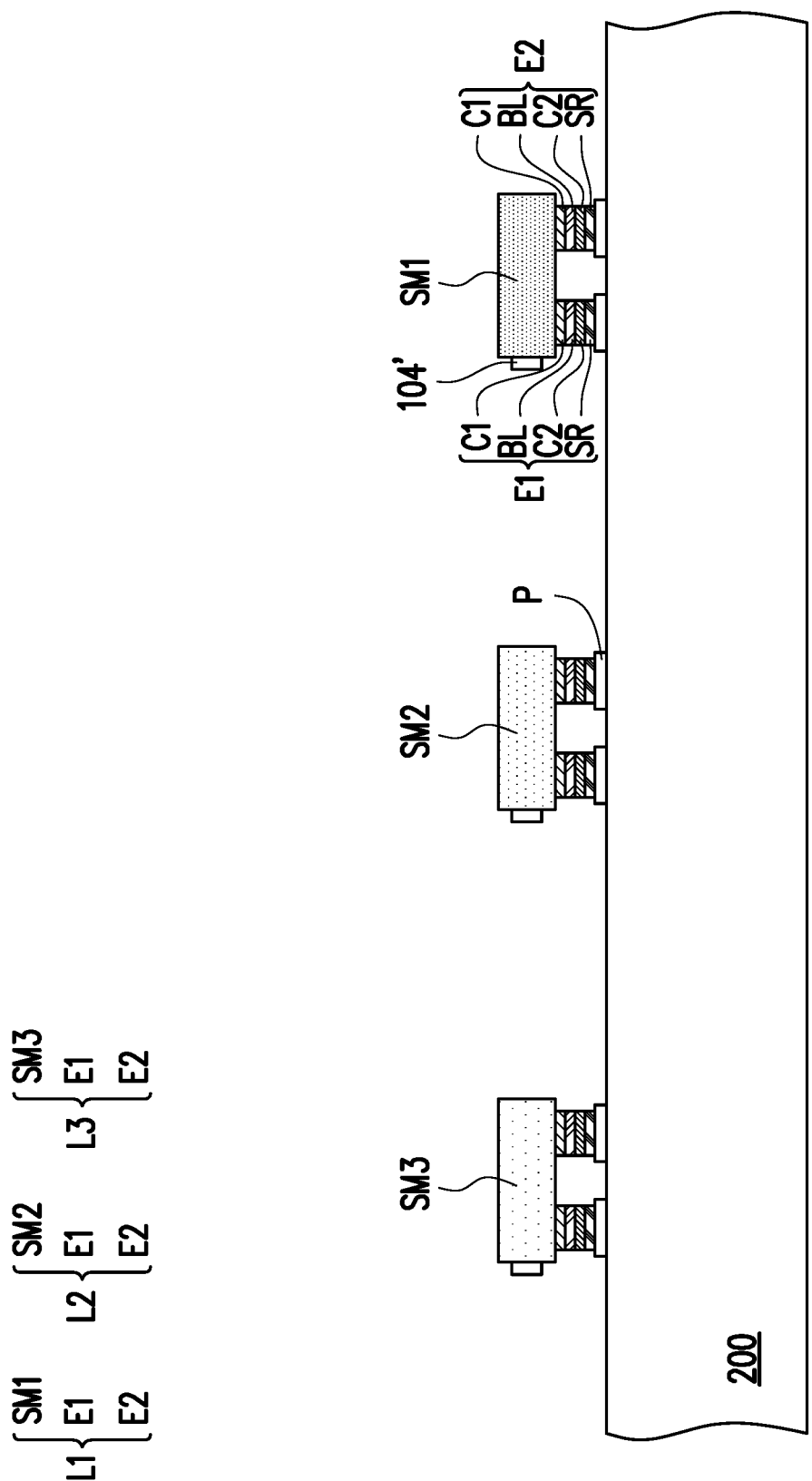

FIG. 6A to FIG. 6C are schematic cross-sectional views of a fabrication method of a display device according to an embodiment of the disclosure.

With reference to FIG. 6A, multiple light-emitting diodes L1 are formed on the growth substrate 100a. In this embodiment, the growth substrate 100a includes the substrate 102 and the tether structure 104. In some embodiments, a sacrificial layer (not shown) and the tether structure 104 are formed on the substrate 102. Then, the light-emitting diode L1 connected to the tether structure 104 is formed. After that, the sacrificial layer is removed to form a gap between the light-emitting diode L1 and the substrate 102. After the sacrificial layer is removed, the light-emitting diode L1 is fixed on the tether structure 104 on the growth substrate 100a.

In this embodiment, each of the light-emitting diodes L1 includes the semiconductor stack layer SM1 and the two electrodes E1 and E2. The two electrodes E1 and E2 are formed on the semiconductor stack layer SM1. The structure of the light-emitting diode L1 is similar to the light-emitting diode L of FIG. 1 or the light-emitting diode La of FIG. 2. For related description, reference may be made to FIG. 1 and FIG. 2.

In this embodiment, the electrodes E1 and E2 of the light-emitting diode L1 are located on one side of the light-emitting diode L1 facing toward the substrate 102.

One or more light-emitting diodes L1 are lifted with the transfer device TD. When the light-emitting diode L1 is lifted from the growth substrate 100a, the tether structure 104 is broken by force. In some embodiments, the partially broken tether structure 104' remains on the lifted light-emitting diodes L1, and the other partially broken tether structure 104" remains on the substrate 102. Nonetheless, the disclosure is not limited thereto.

In this embodiment, the viscous material of the transfer device TD includes, for example, polydimethylsiloxane (PDMS). In addition, the transfer device TD lifts the light-emitting diode L1 by the Van der Waals force between the transfer device TD and the light-emitting diode L1. In other embodiments, the transfer device TD lifts the light-emitting diode L1 by vacuum attraction, static electricity, or the like.

With reference to FIG. 6B, the light-emitting diode L1 is transferred to the circuit substrate 200 with the transfer device TD.

In this embodiment, the circuit substrate 200 includes multiple pads P. The pads P are electrically connected to active elements (not shown) or signal lines (not shown) in the circuit substrate 200. The position of each light-emitting diode L1 corresponds to two pads P of the circuit substrate 200.

In some embodiments, the material selected for the pads P includes gold, nickel, copper, tin, indium, tin-silver mixed metal, tin-copper mixed metal, tin-silver-copper mixed metal, or a combination of the above materials. In some embodiments, the thickness T5 of the pads P is not greater than 8 μm, thereby reducing the possibility that the pads P is susceptible to damage due to stress.

With reference to FIG. 6C, the light-emitting diodes L2 and L3 are formed in a way similar to that of FIG. 6A and FIG. 6B, and the light-emitting diodes L2 and L3 are transferred onto the circuit substrate 200.

The light-emitting diodes L1, L2, and L3 are heated to eutectically bond the metal layers SR of the light-emitting diodes L1, L2, and L3 to the pads P.

Based on the above, the barrier layer BL shields metal elements in the metal layer SR from being diffused to the first conductive layer C1, thereby preventing that intermetallic compounds are not generated from reaction because of adversely affected adhesion between the metal layer SR and the first conductive layer C1, resulting in cracks between the metal layer SR and the first conductive layer C1. In this way, connection between the light-emitting diodes L1, L2, and L3 and the pads P is improved. In addition, since the electrodes E1 and E2 of the light-emitting diodes L1, L2, and L3 include the metal layer SR, the light-emitting diodes L1, L2, and L3 may be bonded to the circuit substrate 200 without disposing solder balls or conductive glue on the circuit substrate 200.

FIG. 7A to FIG. 7F are schematic cross-sectional views of a fabrication method of a display device according to an embodiment of the disclosure.

Figure 7A:
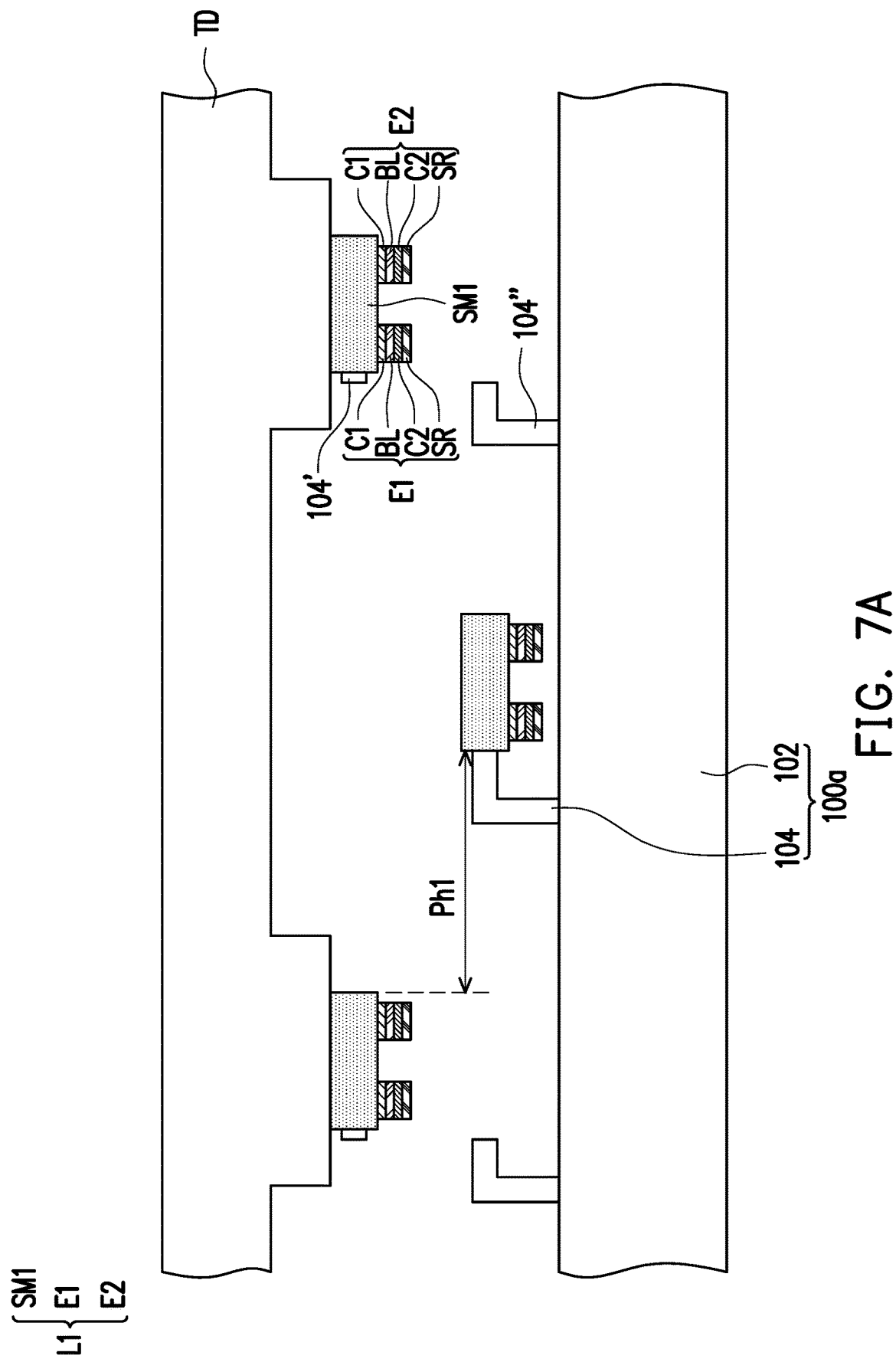
FIG. 7A to FIG. 7F are schematic cross-sectional views of a fabrication method of a display device according to an embodiment of the disclosure.

With reference to FIG. 7A, multiple light-emitting diodes L1 are formed on the growth substrate 100a. In this embodiment, the growth substrate 100a includes the substrate 102 and the tether structure 104. In some embodiments, a sacrificial layer (not shown) and the tether structure 104 are formed on the substrate 102. Then, the light-emitting diode L1 connected to the tether structure 104 is formed. After that, the sacrificial layer is removed to form a gap between the light-emitting diode L1 and the substrate 102. After the sacrificial layer is removed, the light-emitting diode L1 is fixed on the tether structure 104 on the growth substrate 100a.

In this embodiment, each of the light-emitting diodes L1 includes the semiconductor stack layer SM1 and the two electrodes E1 and E2. The two electrodes E1 and E2 are formed on the semiconductor stack layer SM1. The structure of the light-emitting diode L1 is similar to the light-emitting diode L of FIG. 1 or the light-emitting diode La of FIG. 2. For related description, reference may be made to FIG. 1 and FIG. 2.

In this embodiment, the electrodes E1 and E2 of the light-emitting diode L1 are located on one side of the light-emitting diode L1 facing toward the substrate 102.

One, more, or all of the light-emitting diodes L1 are lifted with the transfer device TD. When the light-emitting diode L1 is lifted from the growth substrate 100a, the tether structure 104 is broken by force. In some embodiments, the partially broken tether structure 104' remains on the lifted light-emitting diodes L1, and the other partially broken tether structure 104" remains on the substrate 102. Nonetheless, the disclosure is not limited thereto.

In this embodiment, the viscous material of the transfer device TD includes, for example, polydimethylsiloxane (PDMS). In addition, the transfer device TD lifts the light-emitting diode L1 by the Van der Waals force between the transfer device TD and the light-emitting diode L1. In other embodiments, the transfer device TD lifts the light-emitting diode L1 by vacuum attraction, static electricity, or the like.

Figure 7B:
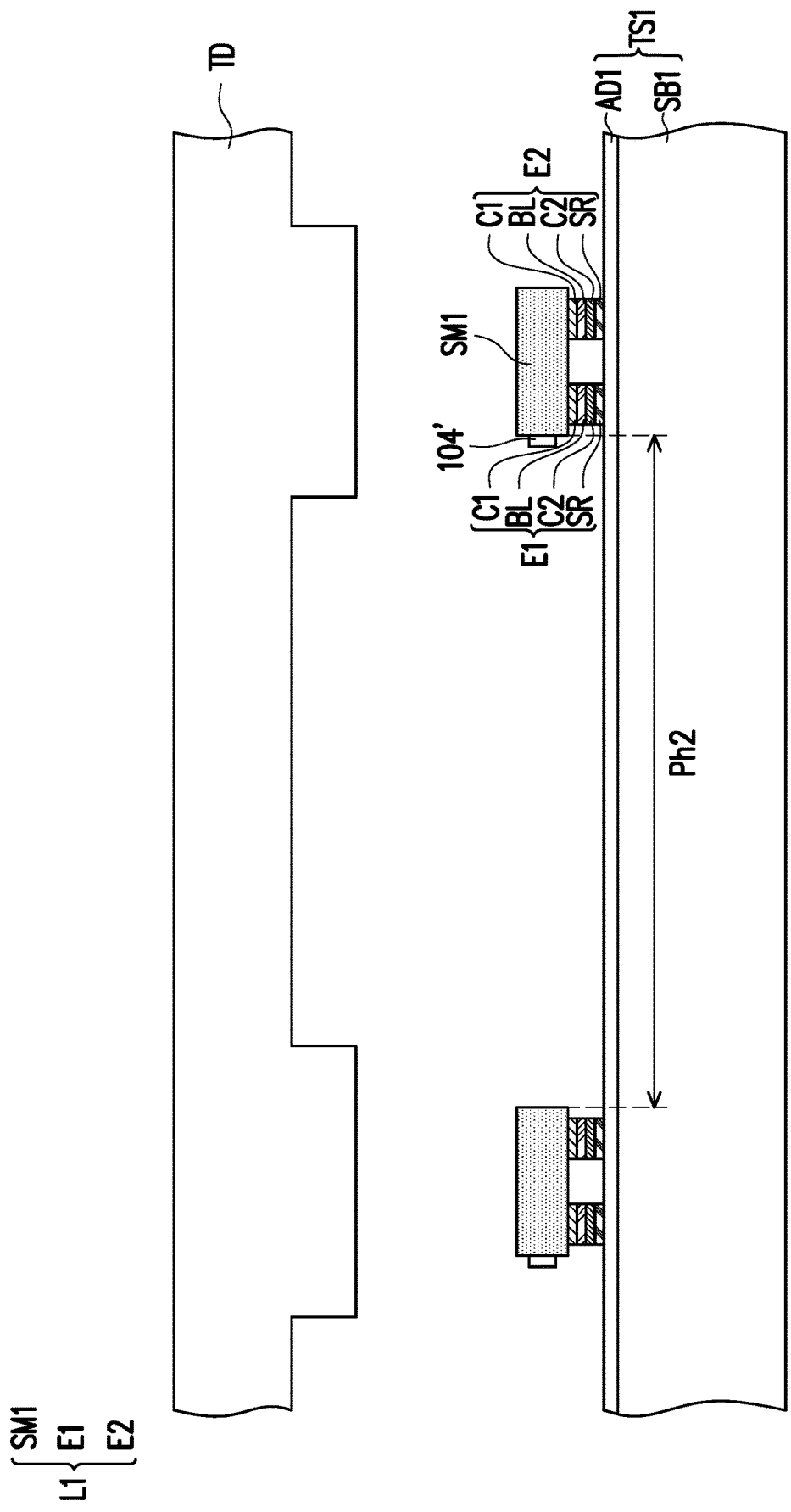

With reference to FIG. 7B, the light-emitting diode L1 is transferred onto the first transfer substrate TS1 with the transfer device TD.

In this embodiment, the first transfer substrate TS1 includes the substrate SB1 and the adhesive layer AD1. In some embodiments, the first transfer substrate TS1 is a tape, and the substrate SB1 includes a soft material. In some embodiments, the first transfer substrate TS1 is a tape and does not include the substrate SB1, and the adhesive layer AD1 is not fixed on the substrate SB1 but by other supporting structures (e.g., metal rings). In some embodiments, the substrate SB1 is a transparent substrate, and the material thereof is, for example, glass, sapphire, or other suitable materials.

In this embodiment, a part of the light-emitting diodes L1 are transferred onto the first transfer substrate TS1, and the other part of the light-emitting diodes L1 remain on the growth substrate 100a. In this embodiment, the electrodes E1 and E2 of the light-emitting diode L1 are located on one side of the light-emitting diode L1 facing toward the first transfer substrate TS1.

With reference to FIG. 7A and FIG. 7B, in some embodiments, the distance Ph2 between the light-emitting diodes L1 on the first transfer substrate TS1 is greater than or equal to the distance Ph1 between the light-emitting diodes L1 on the growth substrate 100 (i.e., the distance of the light-emitting diodes L1 after the transfer is greater than or equal to the distance before the transfer).

Figure 7C:
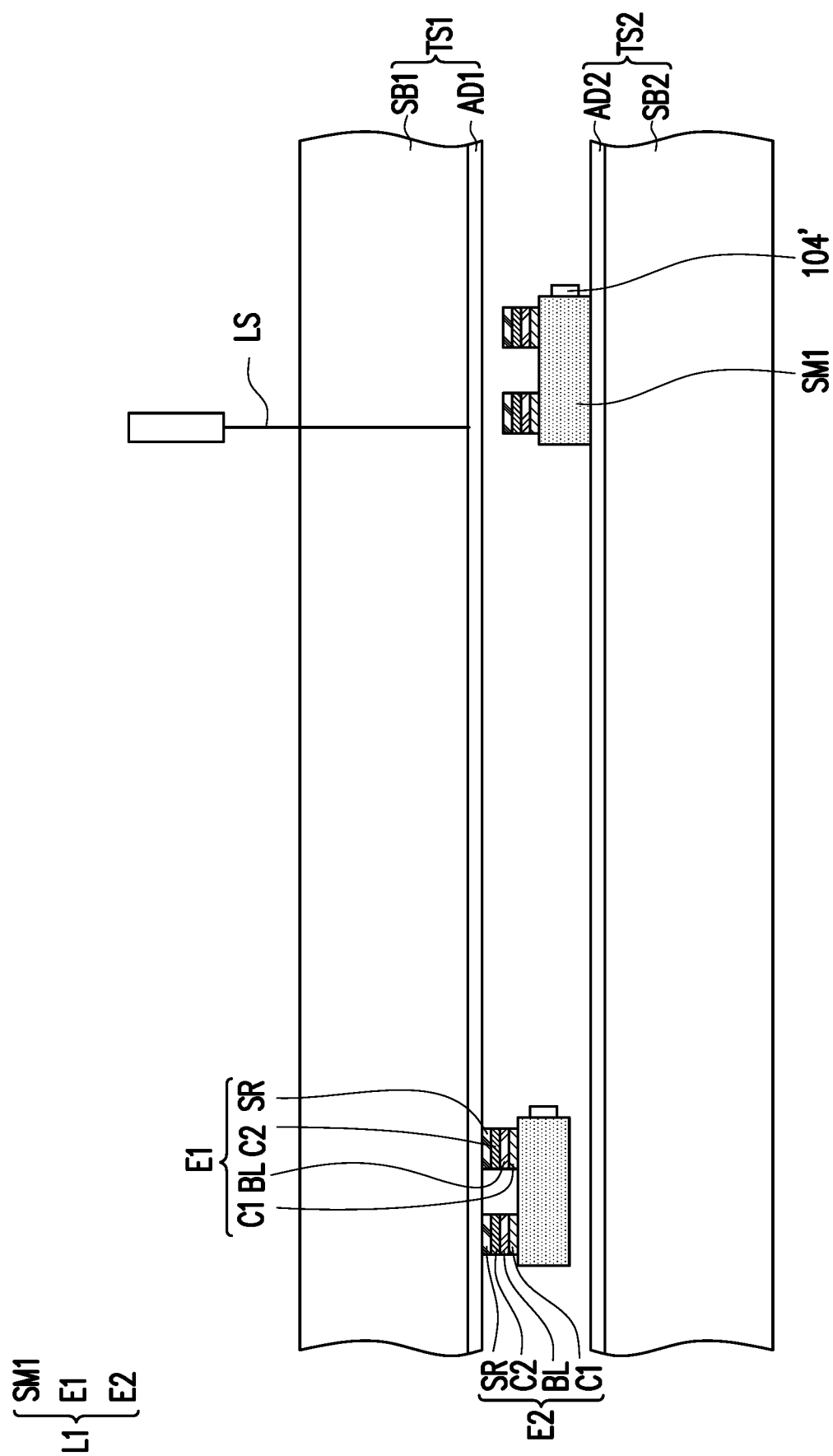

With reference to FIG. 7C, one, more, or all of the light-emitting diodes L1 are transferred from the first transfer substrate TS1 to the second transfer substrate TS2. The second transfer substrate TS2 includes the substrate SB2 and the adhesive layer AD2. In some embodiments, the substrate SB2 includes a thermally conductive material, such as ceramic, metal, or other suitable materials. In some embodiments, the substrate SB2 includes a transparent material, such as glass, sapphire, or other suitable materials.

In this embodiment, the substrate SB1 of the first transfer substrate TS1 is a transparent substrate. After the first transfer substrate TS1 is moved onto the second transfer substrate TS2, the light-emitting diode L1 is irradiated by the laser LS from one side of the substrate SB1. In addition, by laser transfer, at least part of the light-emitting diodes L1 are transferred from the first transfer substrate TS1 onto the adhesive layer AD2 of the second transfer substrate TS2.

In other embodiments, the first transfer substrate TS1 includes tape, and the viscosity of the adhesive layer AD2 is greater than the viscosity of the adhesive layer AD1 (or the tape). After the second transfer substrate TS2 is laminated on the light-emitting diode L1 on the first transfer substrate TS1, the first transfer substrate TS1 is removed. Since the viscosity of the adhesive layer AD2 is greater than the viscosity of the adhesive layer AD1, after the first transfer substrate TS1 is removed, the light-emitting diode L1 remains on the second transfer substrate TS2.

In this embodiment, a part of the light-emitting diodes L1 are transferred onto the second transfer substrate TS2, and the other part of the light-emitting diodes L1 remain on the first transfer substrate TS1. Nonetheless, the disclosure is not limited thereto. In other embodiments, the light-emitting diodes L1 on the first transfer substrate TS1 are each transferred onto the second transfer substrate TS2.

In this embodiment, the electrodes E1 and E2 of the light-emitting diode L1 are located on one side of the light-emitting diode L1 facing away from the second transfer substrate TS2.

Figure 7D:
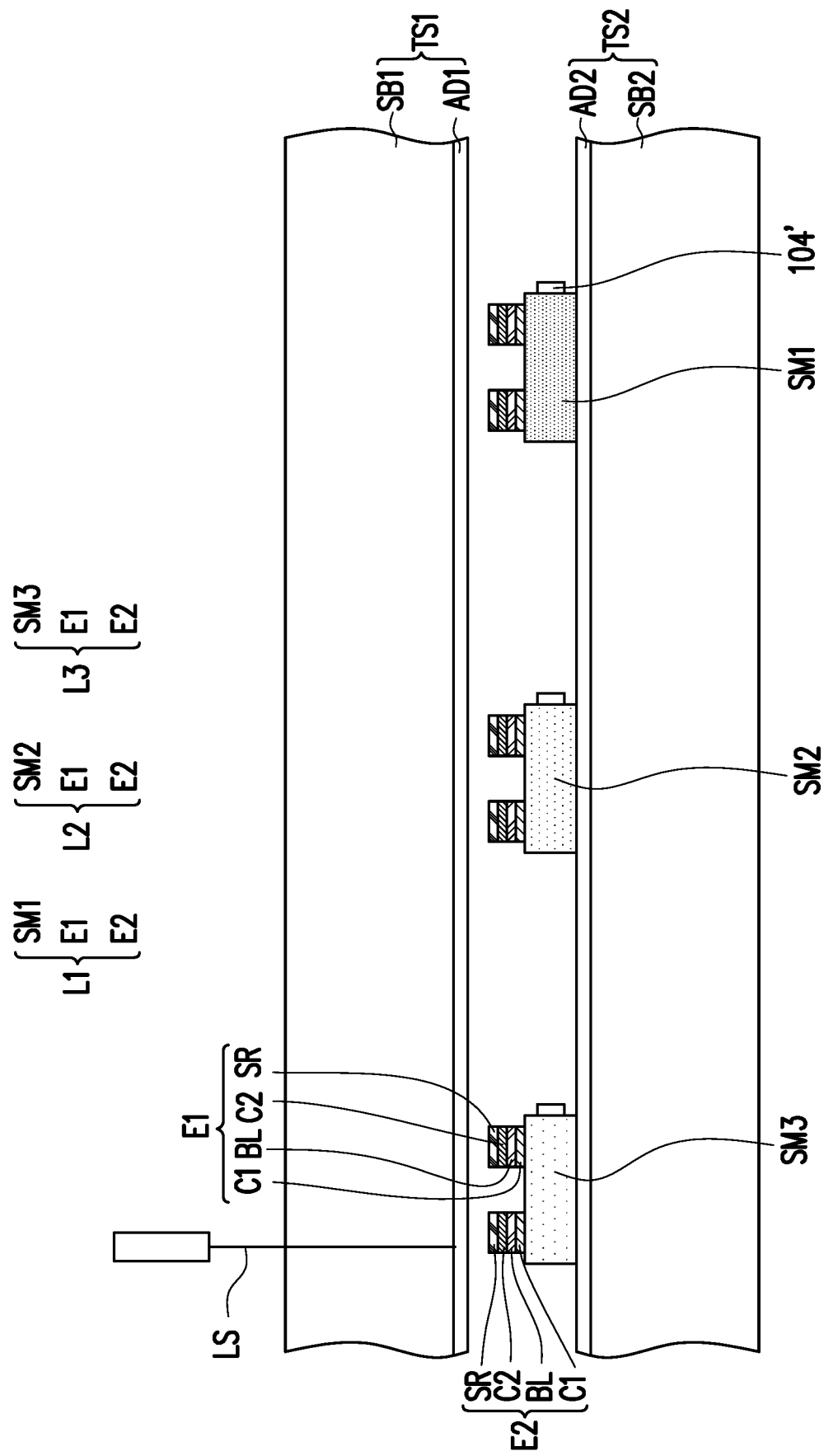

With reference to FIG. 7D, one or more light-emitting diodes L2 and L3 are moved onto the second transfer substrate TS2 in a way similar to that of FIG. 7A to FIG. 7C. The light-emitting diode L2 includes the semiconductor stack layer SM2 and the electrodes E1 and E2, and the light-emitting diode L3 includes the semiconductor stack layer SM3 and the electrodes E1 and E2. The structure of the light-emitting diodes L2 and L3 is similar to the light-emitting diode L of FIG. 1 or the light-emitting diode La of FIG. 2. For related description, reference may be made to FIG. 1 and FIG. 2.

Figure 7E:
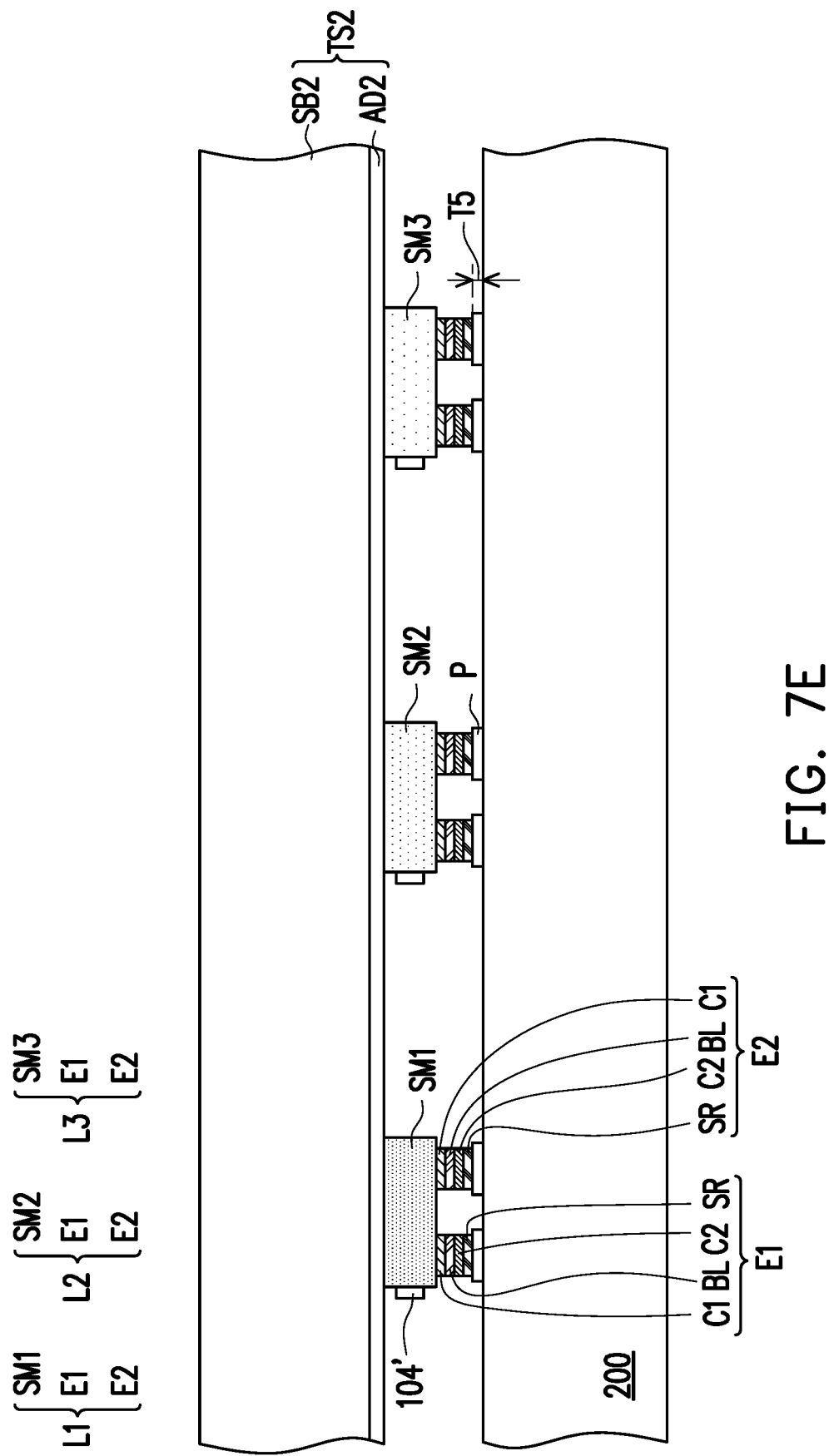

With reference to FIG. 7E, the light-emitting diodes L1, L2, and L3 are transferred from the second transfer substrate TS2 to the circuit substrate 200. In this embodiment, the distance between the light-emitting diodes L1, L2, and L3 on the second transfer substrate TS2 is approximately equal to the distance between the light-emitting diodes L1, L2, and L3 on the circuit substrate 200.

In this embodiment, the circuit substrate 200 includes multiple pads P. The pads P are electrically connected to active elements (not shown) or signal lines (not shown) in the circuit substrate 200. The position of each of the light-emitting diodes L1, L2, and L3 corresponds to two pads P of the circuit substrate 200.

In some embodiments, the material selected for the pads P includes gold, nickel, copper, tin, indium, tin-silver mixed metal, tin-copper mixed metal, tin-silver-copper mixed metal, or a combination of the above materials. In some embodiments, the thickness T5 of the pads P is not greater than 8 µm, thereby reducing the possibility that the pads P is susceptible to damage due to stress.

In some embodiments, the substrate SB2 of the second transfer substrate TS2 includes a thermally conductive material. The second transfer substrate TS2 is pressed on the circuit substrate 200. Then, heat is transferred through the second transfer substrate TS2 to the light-emitting diodes L1, L2, and L3 to heat the light-emitting diodes L1, L2, and L3. The metal layers SR in the electrodes E1 and E2 of the light-emitting diodes L1, L2, and L3 are respectively connected to the corresponding pads P of the circuit substrate 200.

In some embodiments, the substrate SB2 includes a transparent material, such as glass, sapphire, or other suitable materials. The second transfer substrate TS2 is pressed on the circuit substrate 200. Then, the light-emitting diodes L1, L2, and L3 are irradiated by a laser through the substrate SB2 to heat the light-emitting diodes L1, L2, and L3. The metal layers SR in the electrodes E1 and E2 of the light-emitting diodes L1, L2, and L3 are respectively connected to the corresponding pads P of the circuit substrate 200.

In some embodiments, the material selected for the pads P includes a material with improved eutectic bonding with the metal layer SR. After the light-emitting diodes L1, L2, and L3 are heated, the metal layer SR is eutectically bonded to the pads P, and the metal layer SR electrically connects to the barrier layer BL to the corresponding pads P.

Figure 7F:
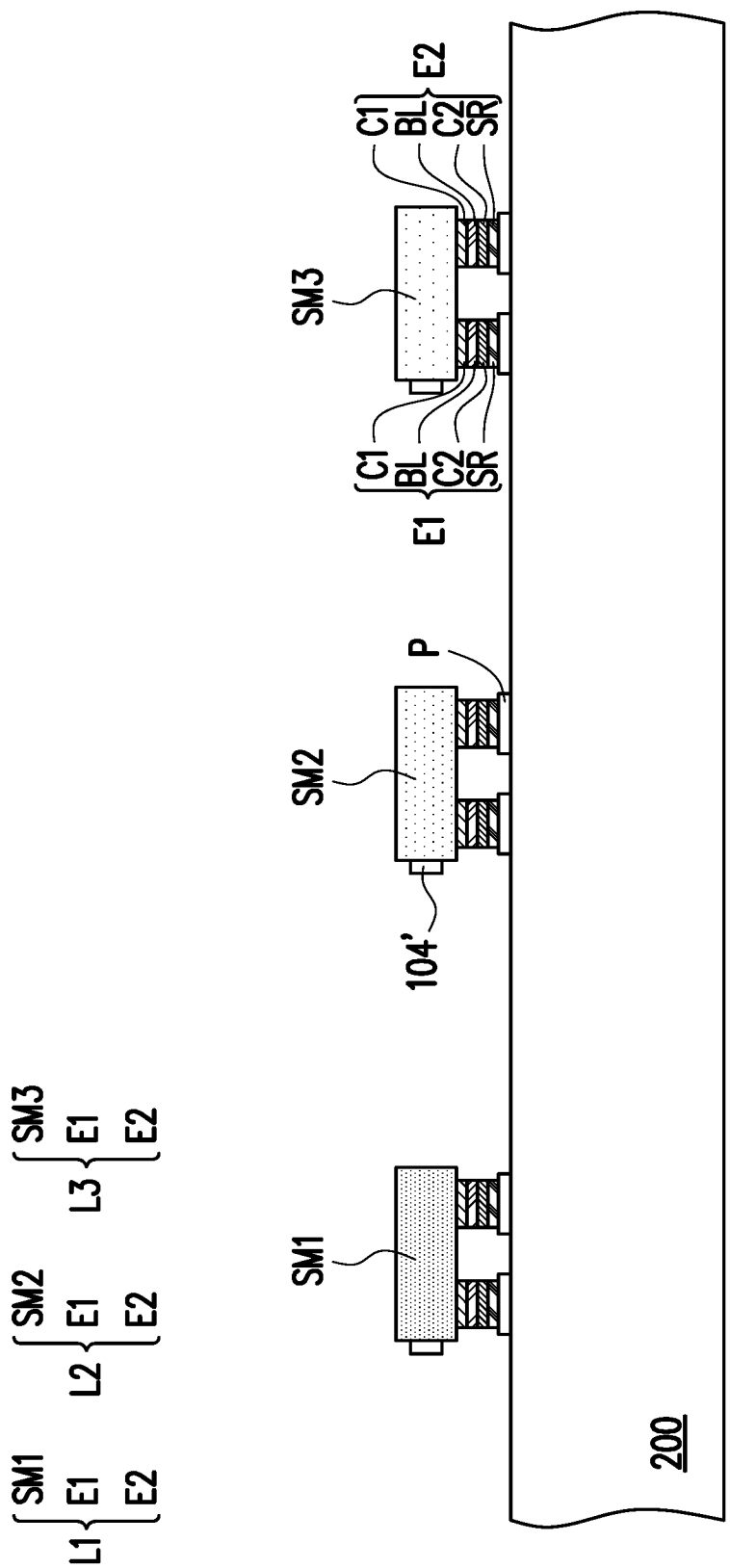

With reference to FIG. 7F, the second transfer substrate TS2 is removed.

Based on the above, the barrier layer BL shields metal elements in the metal layer SR from being diffused to the first conductive layer C1, thereby preventing that intermetallic compounds are not generated from reaction because of adversely affected adhesion between the metal layer SR and the first conductive layer C1, resulting in cracks between the metal layer SR and the first conductive layer C1. In this way, connection between the light-emitting diodes L1, L2, and L3 and the pads P is improved. In addition, since the electrodes E1 and E2 of the light-emitting diodes L1, L2, and L3 include the metal layer SR, the light-emitting diodes L1, L2, and L3 may be bonded to the circuit substrate 200 without disposing solder balls or conductive glue on the circuit substrate 200.

Figure 8A:
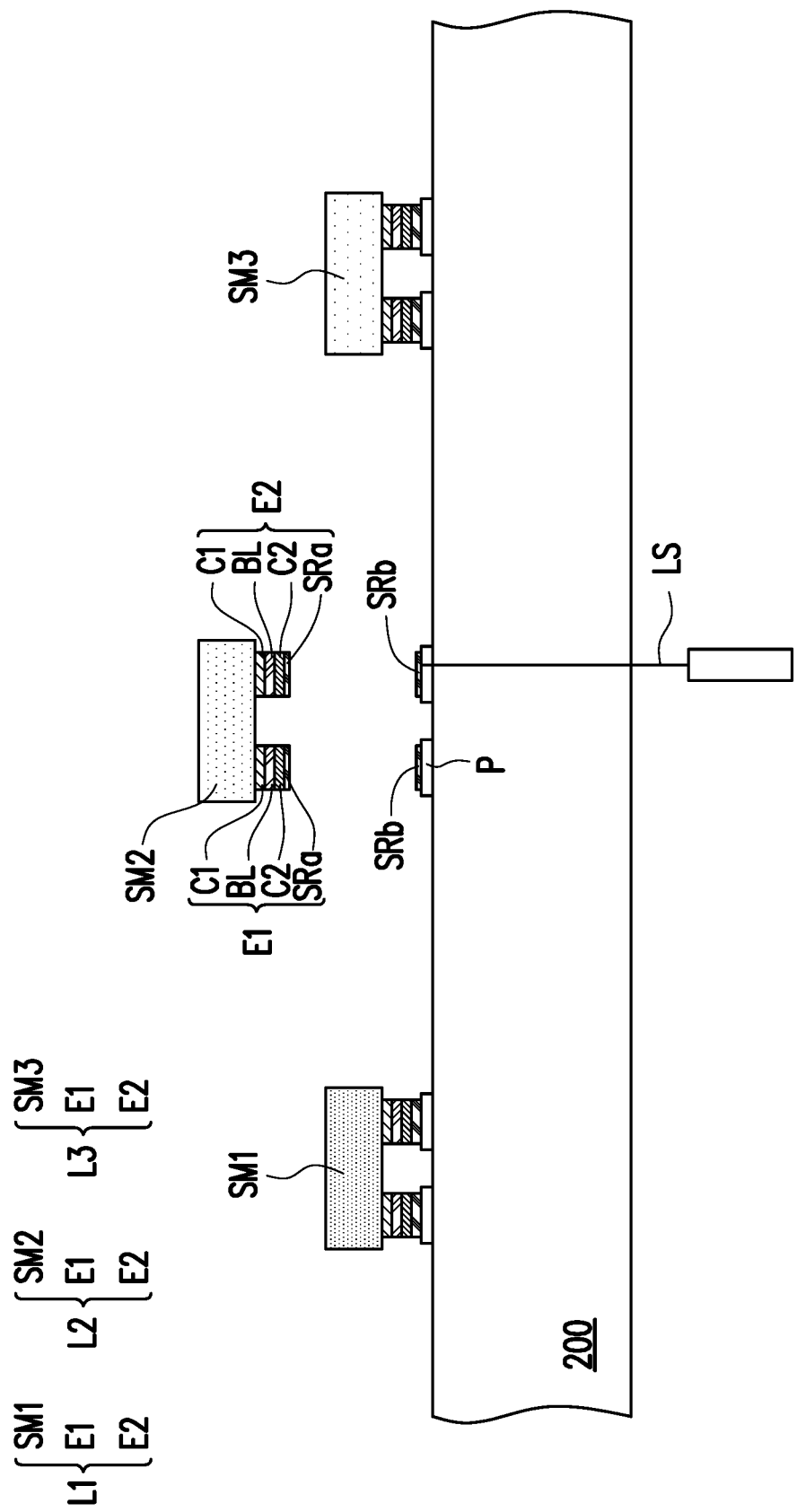
FIG. 8A and FIG. 8B are schematic cross-sectional views of a method for repairing a display device according to an embodiment of the disclosure.
Figure 8B:
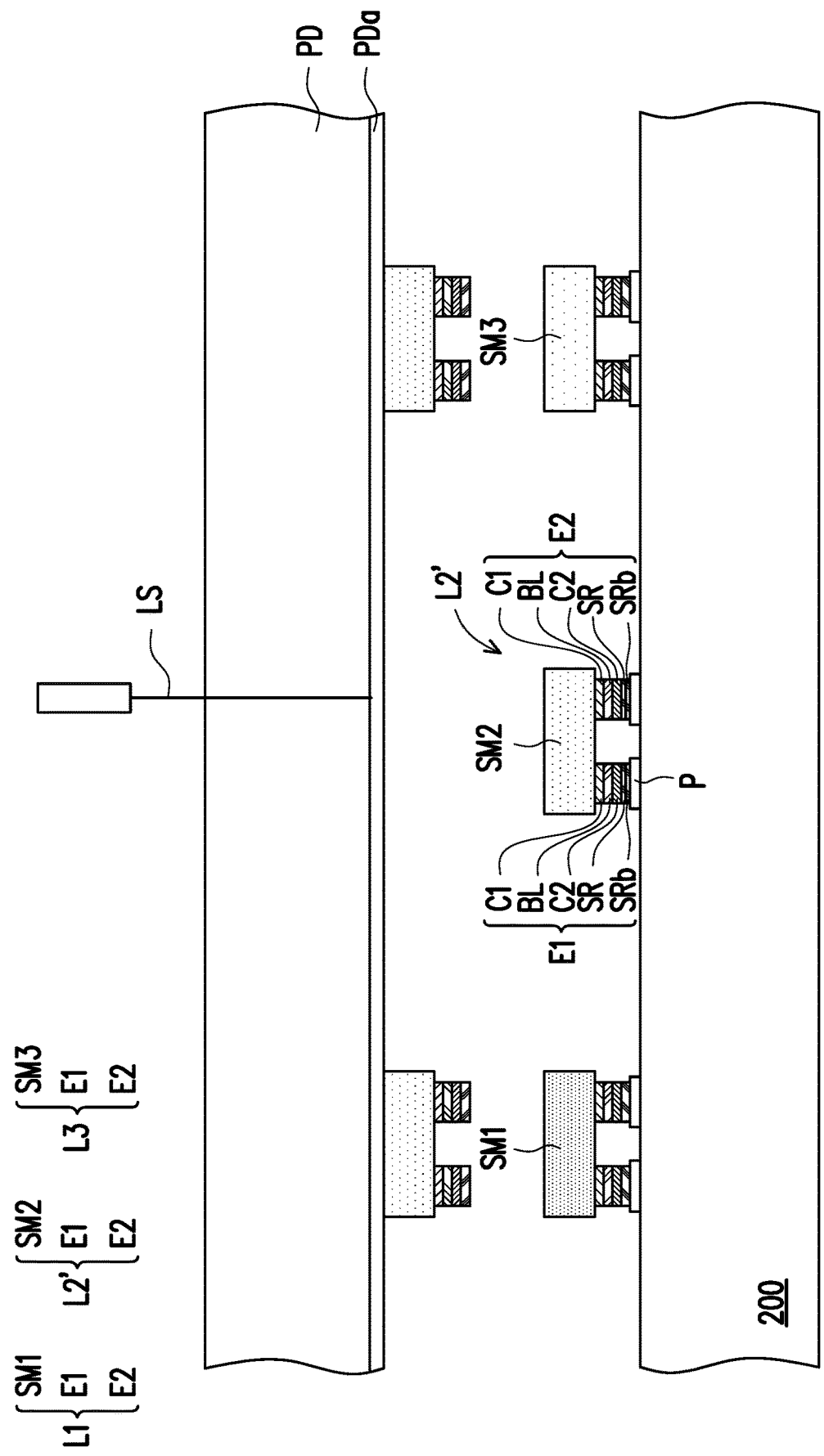

FIG. 8A and FIG. 8B are schematic cross-sectional views of a method for repairing a display device according to an embodiment of the disclosure.

With reference to FIG. 8A, after the light-emitting diodes L1, L2, and L3 are transferred to the circuit substrate 200 in the way of any one of the foregoing embodiments, the light-emitting diodes L1, L2, and L3 are tested. In this embodiment, the light-emitting diode L2 does emit light normally. For example, the light-emitting diode L2 is not correctly aligned with the pads P during transfer or is not correctly bonded to the pads P during heating. As a result, the light-emitting diode L2 does not emit light normally. In some embodiments, a failure occurs in the light-emitting diode L2 per se. As a result, the light-emitting diode L2 does not emit light normally.

In this embodiment, the light-emitting diode L2 may be removed from the circuit substrate 200 by using the laser LS, but the disclosure is not limited thereto. In other embodiments, the light-emitting diode L2 may be removed by heating or by using a pick-and-place module.

In some embodiments, after the light-emitting diode L2 is removed from the circuit substrate 200, the metal layer SR of the light-emitting diode L2 partially remains on the pads P of the circuit substrate 200. For example, after the light-emitting diode L2 is irradiated by a laser or heated to melt the metal layers SR in the electrodes E1 and E2 of the light-emitting diode L2, the light-emitting diode L2 is removed. A part of a molten metal layer SRb remains on the pads P, and the other part of the metal layer SRa is lifted along with the light-emitting diode L2.

With reference to FIG. 8B, a light-emitting diode L2' is transferred onto the pads P of the circuit substrate 200. The structure of the light-emitting diode L2' is similar to the light-emitting diode L of FIG. 1 or the light-emitting diode La of FIG. 2. For related description, reference may be made to FIG. 1 and FIG. 2. The light-emitting diode L2' and the light-emitting diode L2 are light-emitting diodes of the same color. In addition, the light-emitting diode L2' and the light-emitting diode L2 each include the semiconductor stack layer SM2.

In this embodiment, the light-emitting diode L2' is selectively transferred from a substrate PD onto the pads P of the circuit substrate 200 with the laser LS. In this embodiment, the substrate PD is a transfer substrate. In addition, an adhesive layer PDa is present on the surface of the substrate PD. In other embodiments, the substrate PD is a growth substrate. In other embodiments, the light-emitting diode L2' may be transferred onto the pads P of the circuit substrate 200 by using the transfer device TD (as shown in FIG. 7A) or other pick-and-place devices.

After the light-emitting diode L2 that does not emit light normally is removed, since the bondable property of the pads P of the circuit substrate 200 is not affected, the light-emitting diode L2' may be electrically connected to the circuit substrate 200 directly with the pads P originally corresponding to the light-emitting diode L2. Then, the pads P of the circuit substrate 200 and/or the electrodes E1 and E2 of the light-emitting diode L2' are irradiated or heated by a laser to electrically connect the metal layer SR of the light-emitting diode L2' to the pads P originally corresponding to the light-emitting diode L2. In some embodiments, the metal layer SR of the light-emitting diode L2' is fused with the metal layer SRb of the light-emitting diode L2 remaining on the pads P.

In this embodiment, the light-emitting diode L2' is placed on the pads P originally corresponding to the light-emitting diode L2, but the disclosure is not limited thereto. In other embodiment, the light-emitting diode L2' is placed on other redundancy pads (not shown) configured for repair and being around the pads P originally corresponding to the light-emitting diode L2. In addition, the light-emitting diode L2' is electrically connected to other components in the circuit substrate 200 through the redundancy pads.

In this embodiment, since the electrodes E1 and E2 of the light-emitting diode L2' for repair include the metal layer SR, the light-emitting diode L2' may be bonded to the circuit substrate 200 without additionally forming solder balls or conductive glue on the circuit substrate 200. In addition, since it is not required to additionally form solder balls or conductive glue on the circuit substrate 200, failure due to offset of the additionally formed solder balls or conductive glue may be avoided in the repair process. In other words, with the metal layer SR of the light-emitting diode L2', the yield and accuracy of the repair process are increased.

In this embodiment, the light-emitting diodes L1, L2, and L3 include light-emitting diodes of different colors (e.g., blue, green, and red), but the disclosure is not limited thereto. In other embodiments, the light-emitting diodes L1, L2, and L3, and L2' include light-emitting diodes of the same color, and light emitted by the light-emitting diodes L1, L2, and L3, and L2' is converted into light of other colors through other color conversion elements (e.g., a quantum dot material, a phosphor material, or the like).

In summary of the foregoing, in the disclosure, the electrodes of the light-emitting diode each include the first conductive layer, the barrier layer, and the metal layer. The barrier layer shields metal elements in the metal layer from being diffused to the first conductive layer, thereby preventing that intermetallic compounds are not generated from reaction because of adversely affected adhesion between the metal layer and the first conductive layer, resulting in cracks between the metal layer and the first conductive layer. In this way, connection between the light-emitting diodes and the pads is improved. In addition, since the electrodes of the light-emitting diodes include the metal layer, the light-emitting diodes may be bonded to the circuit substrate without disposing solder balls or conductive glue on the circuit substrate. Based on the above, after the bonding process between the light-emitting diode and the pads, if defective light-emitting diodes are detected during inspection, repair and rebonding of the defective light-emitting diodes may be easily and accurately performed by using the light-emitting diodes in which the electrodes include the metal layer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
a circuit substrate; and
a light-emitting diode, wherein two electrodes of the light-emitting diode are connected to two pads of the circuit substrate, wherein each of the electrodes of the light-emitting diode comprises:
a first conductive layer, directly connected to a semiconductor stack layer of the light-emitting diode;
a barrier layer, electrically connected to the semiconductor stack layer of the light-emitting diode through the first conductive layer, wherein an adhesion of a material selected for the first conductive layer to the semiconductor stack layer is greater than an adhesion of a material selected for the barrier layer to the semiconductor stack layer, wherein the barrier layer is in direct contact with the first conductive layer; and
a metal layer, electrically connecting the barrier layer to a corresponding one of the pads, wherein a melting point of the metal layer is lower than 260 degrees Celsius, wherein the first conductive layer is located between the barrier layer and the semiconductor stack layer, the barrier layer is located between the first conductive layer and the metal layer, a shape of a perpendicular projection of the metal layer on the semiconductor stack layer and a shape of a perpendicular projection of the barrier layer on the semiconductor stack layer are substantially the same as each other.

2. The display device according to claim 1, wherein the material selected for the first conductive layer comprises titanium, chromium, or a combination of the above materials.

3. The display device according to claim 1, wherein the material selected for the barrier layer comprises nickel, copper, palladium, or a combination of the above materials.

4. The display device according to claim 1, wherein a material selected for the metal layer comprises tin, indium, bismuth, tin-bismuth mixed metal, tin-indium mixed metal, tin-copper mixed metal, tin-silver mixed metal, tin-antimony mixed metal, tin-zinc mixed metal, tin-silver-copper mixed metal, tin-silver-copper-bismuth mixed metal, or a combination or a stack of the above materials.

5. The display device according to claim 1, wherein a material selected for the two pads comprises gold, nickel, copper, tin, indium, tin-silver mixed metal, tin-copper mixed metal, tin-silver-copper mixed metal, or a combination or a stack of the above materials.

6. The display device according to claim 1, wherein the two electrodes each further comprise:
a second conductive layer, located between the barrier layer and the metal layer, wherein a wettability of the metal layer on a material selected for the second conductive layer is greater than a wettability of the metal layer on the material selected for the barrier layer.

7. The display device according to claim 6, wherein a thickness of the second conductive layer is less than or equal to a thickness of the barrier layer.

8. The display device according to claim 6, wherein the material selected for the second conductive layer comprises gold, silver, copper, palladium, nickel, or a combination of the above materials.

9. The display device according to claim 1, wherein a thickness of the two pads is not greater than 8 µm.

10. A light-emitting diode substrate, comprising:
a growth substrate; and
a light-emitting diode, comprising:
a semiconductor stack layer, formed on the growth substrate; and
two electrodes, formed on the semiconductor stack layer, wherein each of the electrodes comprises:
a first conductive layer, directly connected to the semiconductor stack layer;
a barrier layer, formed on the first conductive layer, wherein an adhesion of a material selected for the first conductive layer to the semiconductor stack layer is greater than an adhesion of a material selected for the barrier layer to the semiconductor stack layer, wherein the barrier layer is in direct contact with the first conductive layer; and
a metal layer, formed on the barrier layer, wherein a melting point of the metal layer is lower than 260 degrees Celsius, wherein the first conductive layer is located between the barrier layer and the semiconductor stack layer, the barrier layer is located between the first conductive layer and the metal layer, a shape of a perpendicular projection of the metal layer on the semiconductor stack layer and a shape of a perpendicular projection of the barrier layer on the semiconductor stack layer are substantially the same as each other.

11. The light-emitting diode substrate according to claim 10, wherein the two electrodes each further comprise:
a second conductive layer, located between the barrier layer and the metal layer, wherein a wettability of the metal layer on a material selected for the second conductive layer is greater than a wettability of the metal layer on the material selected for the barrier layer.

12. The light-emitting diode substrate according to claim 11, wherein a thickness of the second conductive layer is less than or equal to a thickness of the barrier layer.

13. The light-emitting diode substrate according to claim 11, wherein the material selected for the first conductive layer comprises titanium, chromium, or a combination of the above materials, the material selected for the barrier layer comprises nickel, copper, palladium, or a combination of the above materials, the material selected for the second conductive layer comprises gold, silver, copper, palladium, nickel, or a combination of the above materials, and a material selected for the metal layer comprises tin, indium, bismuth, tin-bismuth mixed metal, tin-indium mixed metal, tin-copper mixed metal, tin-silver mixed metal, tin-antimony mixed metal, tin-zinc mixed metal, tin-silver-copper mixed metal, tin-silver-copper-bismuth mixed metal, or a combination or a stack of the above materials.

14. A fabrication method of a display device, comprising:
forming a plurality of light-emitting diodes, wherein each of the light-emitting diodes comprises:
a semiconductor stack layer; and
two electrodes, formed on the semiconductor stack layer, wherein each of the electrodes comprises:
a first conductive layer, formed on the semiconductor stack layer, and directly connected to the semiconductor stack layer;
a barrier layer, formed on the first conductive layer, wherein an adhesion of a material selected for the first conductive layer to the semiconductor stack layer is greater than an adhesion of a material selected for the barrier layer to the semiconductor stack layer, wherein the barrier layer is in direct contact with the first conductive layer; and
a metal layer, formed on the barrier layer, wherein a melting point of the metal layer is lower than 260 degrees Celsius, wherein the first conductive layer is located between the barrier layer and the semiconductor stack layer, the barrier layer is located between the first conductive layer and the metal layer, a shape of a perpendicular projection of the metal layer on the semiconductor stack layer and a shape of a perpendicular projection of the barrier layer on the semiconductor stack layer are substantially the same as each other;
transferring one of the light-emitting diodes onto a circuit substrate, wherein the circuit substrate comprises a plurality of pads, and a position of the one of the light-emitting diodes corresponds to two of the pads of the circuit substrate; and
heating the one of the light-emitting diodes to eutectically bond the metal layers of the one of the light-emitting diodes to the two of the pads.

15. The fabrication method according to claim 14, wherein the method of heating the one of the light-emitting diodes comprises conductive heating, a single-point laser, a planar laser, or a linear laser.

16. The fabrication method according to claim 14, further comprising:
transferring another one of the light-emitting diodes onto the circuit substrate, wherein a position of the another one of the light-emitting diodes corresponds to another two of the pads of the circuit substrate;
testing the one of the light-emitting diodes and the another one of the light-emitting diodes, wherein the another one of the light-emitting diodes does not emit light normally;
removing the another one of the light-emitting diodes from the circuit substrate;
transferring still another one of the light-emitting diodes onto the another two of the pads of the circuit substrate; and
heating the still another one of the light-emitting diodes to electrically connect the metal layers of the still another one of the light-emitting diodes to the another two of the pads.

17. The fabrication method according to claim 16, wherein after the another one of the light-emitting diodes is removed from the circuit substrate, the metal layers of the another one of the light-emitting diodes partially remain on the another two of the pads of the circuit substrate.

18. The fabrication method according to claim 14, further comprising:
forming the one of the light-emitting diodes on a growth substrate;
transferring the one of the light-emitting diodes from the growth substrate onto a first transfer substrate;
transferring the one of the light-emitting diodes from the first transfer substrate onto a second transfer substrate; and
transferring the one of the light-emitting diodes from the second transfer substrate onto the circuit substrate.

19. The fabrication method according to claim 18, wherein the first transfer substrate comprises a tape or a transparent substrate carrying an adhesive layer.

20. The fabrication method according to claim 14, further comprising:
forming the one of the light-emitting diodes on a growth substrate, wherein the growth substrate comprises a substrate and a tether structure located on the substrate, and the one of the light-emitting diodes is fixed on the tether structure, wherein the electrodes of the one of the light-emitting diodes are located on one side of the one of the light-emitting diodes facing away from the substrate.

21. The fabrication method according to claim 14, further comprising:
forming the one of the light-emitting diodes on a growth substrate, wherein the growth substrate comprises a substrate and a tether structure located on the substrate, and the one of the light-emitting diodes is fixed on the tether structure, wherein the electrodes of the one of the light-emitting diodes are located on one side of the one of the light-emitting diodes facing toward the substrate.

22. The light-emitting diode substrate according to claim 10, wherein the first conductive layer is located between the barrier layer and the semiconductor stack layer, wherein the metal layer is separated from sidewalls of the barrier layer and sidewalls of the first conductive layer.

* * * * *